(12) United States Patent
Lim et al.

(10) Patent No.: US 11,522,028 B2
(45) Date of Patent: Dec. 6, 2022

(54) DISPLAY DEVICE HAVING A TRENCH PROVIDED BETWEEN FIRST SUBPIXEL AND SECOND SUBPIXEL AND METHOD FOR MANUFACTURING THE SAME

(71) Applicant: LG Display Co., Ltd., Seoul (KR)

(72) Inventors: Hyeongjun Lim, Paju-si (KR); Ho-Jin Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 106 days.

(21) Appl. No.: 16/942,368

(22) Filed: Jul. 29, 2020

(65) Prior Publication Data
US 2021/0043705 A1 Feb. 11, 2021

(30) Foreign Application Priority Data
Aug. 7, 2019 (KR) .................... 10-2019-0096023

(51) Int. Cl.
| | | |
|---|---|---|
| *H01L 29/205* | (2006.01) | |
| *H01L 27/32* | (2006.01) | |
| *H01L 51/56* | (2006.01) | |
| *H01L 51/52* | (2006.01) | |

(52) U.S. Cl.
CPC ...... *H01L 27/3246* (2013.01); *H01L 27/3258* (2013.01); *H01L 51/5228* (2013.01); *H01L 51/5234* (2013.01); *H01L 51/56* (2013.01); *H01L 2227/323* (2013.01)

(58) Field of Classification Search
CPC ............. H01L 27/3246; H01L 27/3258; H01L 51/5228; H01L 51/5234; H01L 51/56
USPC .......................................................... 257/91
See application file for complete search history.

(56) References Cited

U.S. PATENT DOCUMENTS

| | | |
|---|---|---|
| 9,935,161 B2 | 4/2018 | Kim et al. |
| 10,297,652 B2 | 5/2019 | Kim et al. |
| 2014/0183479 A1* | 7/2014 | Park .................... H01L 27/3218 438/34 |

(Continued)

FOREIGN PATENT DOCUMENTS

| | | |
|---|---|---|
| EP | 3252823 A1 | 12/2017 |
| KR | 10-2019-0018922 A | 2/2019 |
| WO | WO 2009/157496 A1 | 12/2009 |

OTHER PUBLICATIONS

Intellectual Property India, Examination report, IN Patent Application No. 202014031133, dated Nov. 11, 2021, six pages.

*Primary Examiner* — Phuc T Dang
(74) *Attorney, Agent, or Firm* — Fenwick & West LLP

(57) ABSTRACT

A display device and a method for manufacturing a display device are disclosed. The display device may prevent a leakage current from occurring between adjacent pixels. The display device comprises a substrate, a first electrode provided in each of a first subpixel and a second subpixel arranged to be adjacent to the first subpixel, on the substrate, a trench provided between the first subpixel and the second subpixel, a light emitting layer provided in each of the first subpixel and the second subpixel on the first electrode, a second electrode provided in each of the first subpixel and the second subpixel on the light emitting layer, and a third electrode electrically connecting the second electrode provided in the first subpixel with the second electrode provided in the second subpixel. The second electrode is disconnected between the first subpixel and the second subpixel by the trench.

13 Claims, 21 Drawing Sheets

(56) References Cited

U.S. PATENT DOCUMENTS

| | | | |
|---|---|---|---|
| 2016/0043341 A1* | 2/2016 | Heo | H01L 27/3279 |
| | | | 438/23 |
| 2017/0352707 A1 | 12/2017 | Kim et al. | |
| 2018/0226455 A1 | 8/2018 | Kim et al. | |
| 2019/0058022 A1* | 2/2019 | Baik | H01L 27/3258 |
| 2019/0198816 A1* | 6/2019 | Park | H01L 51/5265 |

\* cited by examiner

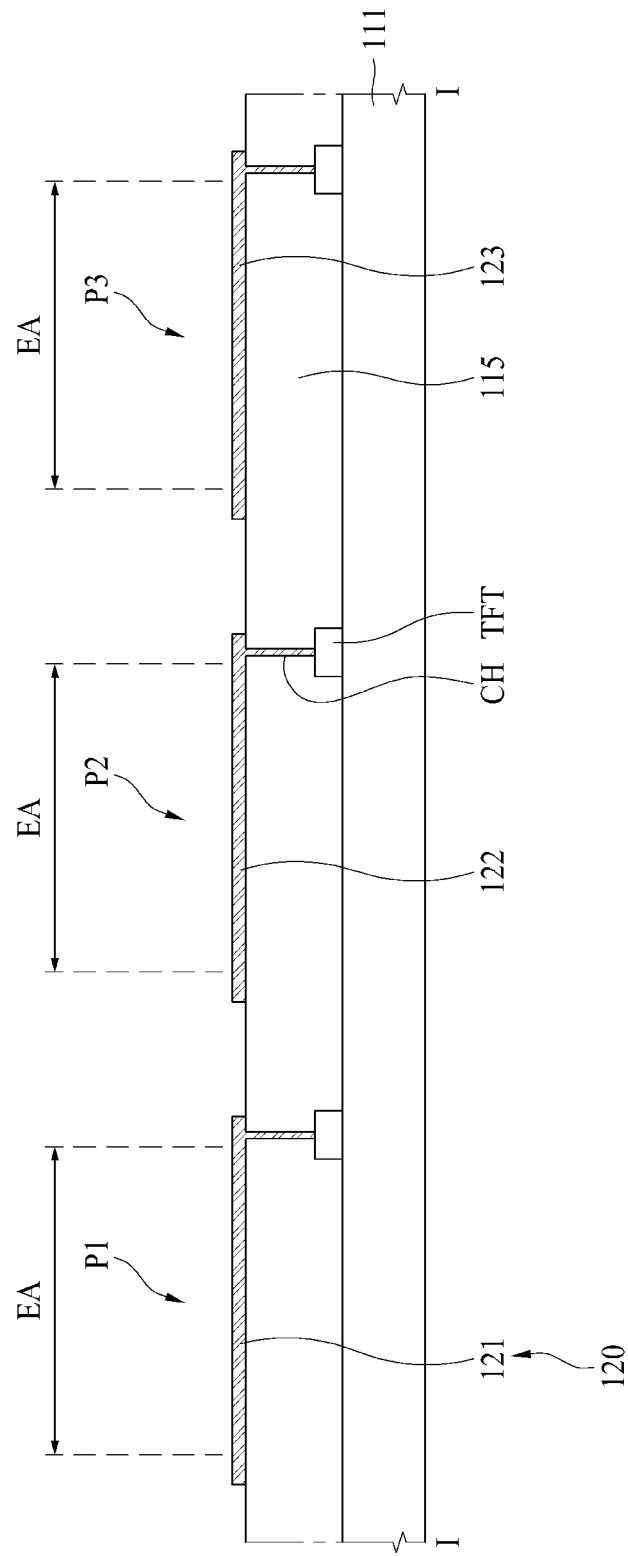

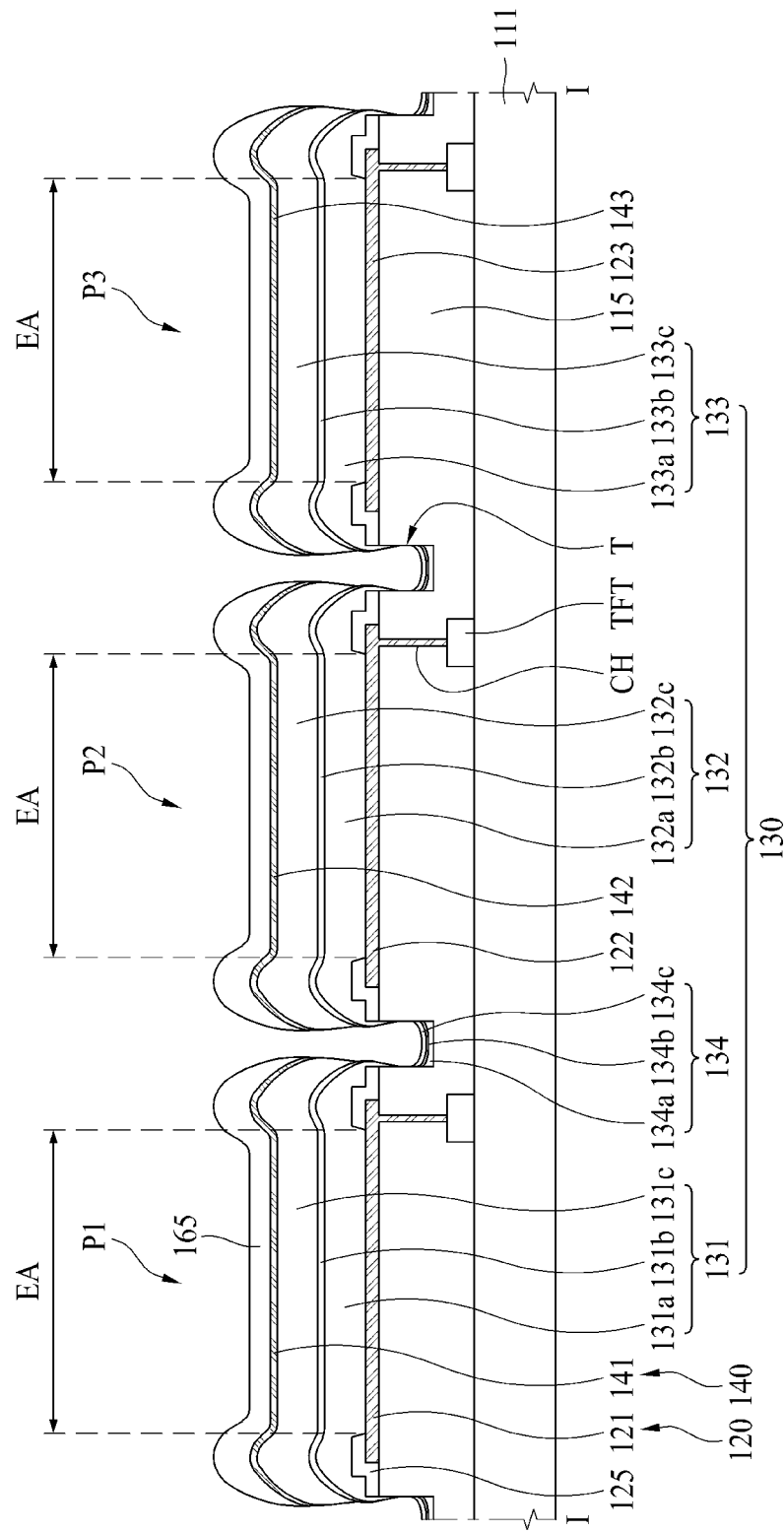

DISPLAY DEVICE HAVING A TRENCH PROVIDED BETWEEN FIRST SUBPIXEL AND SECOND SUBPIXEL AND METHOD FOR MANUFACTURING THE SAME

CROSS-REFERENCE TO RELATED APPLICATIONS

This application claims priority from Republic of Korea Patent Application No. 10-2019-0096023, filed on Aug. 7, 2019, which is hereby incorporated by reference for all purposes as if fully set forth herein.

BACKGROUND

Technical Field

The present disclosure relates to a display device and a method for manufacturing the same.

Description of the Related Art

With advancement in information-oriented societies, requirements for display devices that display an image have increased in various types. Recently, various display devices such as a liquid crystal display (LCD) device, a plasma display panel (PDP) device, and an organic light emitting display (OLED) device have been widely utilized.

An OLED device out of such display devices is of a spontaneous emission type, has a viewing angle, a contrast ratio, and the like which more excellent than an LCD, and can be decreased in weight and thickness and is advantageous in power consumption because a separate backlight is not required. An OLED device can be driven with a DC low voltage, has a high response speed, and has low manufacturing costs.

Head-mounted displays (HMD) including such an OLED device have been developed recently. A head-mounted display (HMD) is a device that is worn in the form of an eyeglass or a helmet for virtual reality (VR) or augmented reality (AR) in which a focus is formed at a position close to a user's eyes. However, in a head-mounted display of ultra-high resolution, since an interval between pixels is narrow, adjacent pixels may be more easily affected by a leakage current.

SUMMARY

The present disclosure has been made in view of the above problems, and it is an object of the present disclosure to provide a display device and a method for manufacturing the same, which may prevent a leakage current from occurring between adjacent pixels.

It is another object of the present disclosure to provide a display device and a method for manufacturing the same, which may prevent a short from occurring between a second electrode and a charge generating layer.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a substrate, a first electrode provided in each of a first subpixel and a second subpixel arranged to be adjacent to the first subpixel, on the substrate, a trench provided between the first subpixel and the second subpixel, a light emitting layer provided in each of the first subpixel and the second subpixel on the first electrode, a second electrode provided in each of the first subpixel and the second subpixel on the light emitting layer, and a third electrode electrically connecting the second electrode provided in the first subpixel with the second electrode provided in the second subpixel. The second electrode is disconnected between the first subpixel and the second subpixel by the trench.

In accordance with another aspect of the present disclosure, the above and other objects can be accomplished by the provision of a method for manufacturing a display device comprising the steps of forming a first electrode in each of a first subpixel and a second subpixel of a substrate, forming a trench between the first subpixel and the second subpixel, forming a light emitting layer on the first electrode, forming a second electrode on the light emitting layer, forming an insulating layer on the second electrode, and forming a third electrode on the insulating layer. The light emitting layer and the second electrode are disconnected between the first subpixel and the second subpixel by the trench.

According to the present disclosure, in one embodiment, the second electrode is disconnected between adjacent subpixels due to a poor step coverage characteristic. Also, according to an embodiment of the present disclosure, since the second electrode is not deposited on a charge generating layer exposed from a side of the light emitting layer, the second electrode and the charge generating layer may be prevented from being short-circuited therebetween.

Also, according to the present disclosure, in one embodiment, the trench is formed between the subpixels, whereby the light emitting layer may be disconnected between the subpixels. Also, according to an embodiment of the present disclosure, since the charge generating layer formed in each of the adjacent subpixels is spaced apart from another charge generating layer, a current may be prevented from leaking toward the adjacent subpixels through the charge generating layer.

Also, according to an embodiment of the present disclosure, in one embodiment, a space formed between the subpixels is filled with an insulating material, whereby a current may be more stably prevented from leaking between the adjacent subpixels.

Also, in the present disclosure, in one embodiment, the second electrode disconnected between the adjacent subpixels is connected through a third electrode. Therefore, a connection of the second electrode (e.g., a cathode electrode) may be prevented from becoming unstable due to a process error, and the connection of the second electrode (e.g., the cathode electrode) may be ensured.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings.

FIGS. 9A to 9L are cross-sectional views illustrating a manufacturing method of a display device according to one embodiment of the present disclosure.

DETAILED DESCRIPTION

Figure 1:
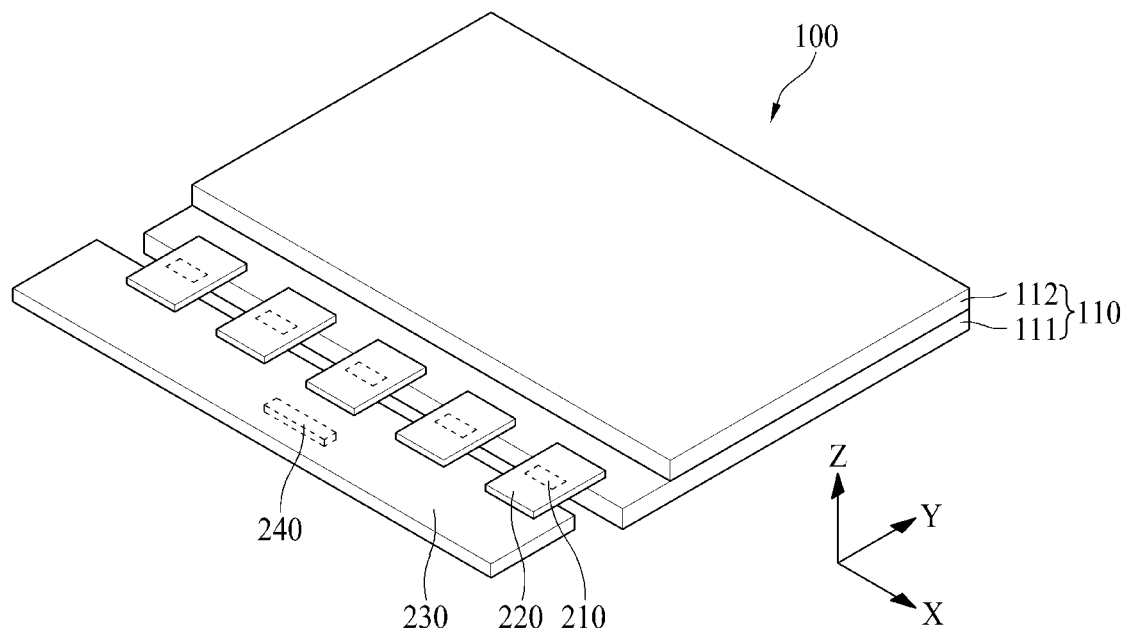
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to the present disclosure will be described in detail with reference to the accompanying drawings. Wherever possible, the same reference numbers will be used throughout the drawings to refer to the same or like parts.

FIG. 1 is a perspective view illustrating a display device according to one embodiment of the present disclosure.

Referring to FIG. 1, the display device 100 according to one embodiment of the present disclosure includes a display panel 110, a source drive integrated circuit 210 (hereinafter, referred to as "IC"), a flexible film 220, a circuit board 230, and a timing controller 240.

The display panel 110 includes a first substrate 111 and a second substrate 112. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film.

On one surface of the first substrate 111 confronting the second substrate 112, there are gate lines, data lines, and pixels. The pixels are prepared in respective areas defined by crossing the gate lines and the data lines.

Each of the pixels may include a thin film transistor, and a light emitting device including an anode electrode, an emission layer, and a cathode electrode. If a gate signal is supplied from the gate line to each pixel through the use of thin film transistor, a predetermined current is supplied to the light emitting device in accordance with a data voltage of the data line. Accordingly, when a high potential voltage is applied to the anode electrode, and a low potential voltage is applied to the cathode electrode, the light emitting device for each of the pixels may emit light with a predetermined brightness in accordance with the predetermined current.

The display panel 110 may include a display area provided with the sub pixels for displaying an image, and a non-display area in which an image is not displayed. The gate lines, the data lines, and the pixels may be provided in the display area, and a gate driver and pads may be provided in the non-display area.

The gate driver supplies gate signals to the gate lines in accordance with a gate control signal which is provided from the timing controller 240. The gate driver may be provided in one side of the display area of the display panel 110, or the non-display area of both peripheral sides of the display panel 110 by a gate driver in panel (GIP) method. In another way, the gate driver may be manufactured in a driving chip, may be mounted on the flexible film, and may be attached to one side of the display area of the display panel 110, or the non-display area of both peripheral sides of the display panel 110 by a tape automated bonding (TAB) method.

The source drive IC 210 receives digital video data and source control signals from the timing controller 240. The source drive IC 210 converts the digital video data into analog data voltages in accordance with the source control signal, and supplies the analog data voltages to the data lines. If the source drive IC 210 is manufactured in a driving chip, the source drive IC 210 may be mounted on the flexible film 220 by a chip on film (COF) method or a chip on plastic (COP) method.

The pads such as data pads may be provided in the non-display area of the display panel 110. In the flexible film 220, there are lines for connecting the pads with the source drive IC 210, and lines for connecting the pads with the lines of the circuit board 230. The flexible film 220 is attached to the pads by the use of anisotropic conducting film, whereby the pads may be connected with the lines of the flexible film 220.

The circuit board 230 may be attached to the flexible film 220. A plurality of circuits, which are realized in a plurality of driving chips, may be mounted on the circuit board 230. For example, the timing controller 240 may be mounted on the circuit board 230. The circuit board 230 may be a printed circuit board or a flexible printed circuit board.

The timing controller 240 receives digital video data and a timing signal from an external system board via a cable of the circuit board 230. The timing controller 240 generates the gate control signal for controlling an operation timing of the gate driver and the source control signal for controlling the source drive IC 210 on the basis of the timing signal. The timing controller 240 supplies the gate control signal to the gate driver, and supplies the source control signal to the source drive IC 210.

Figure 2:
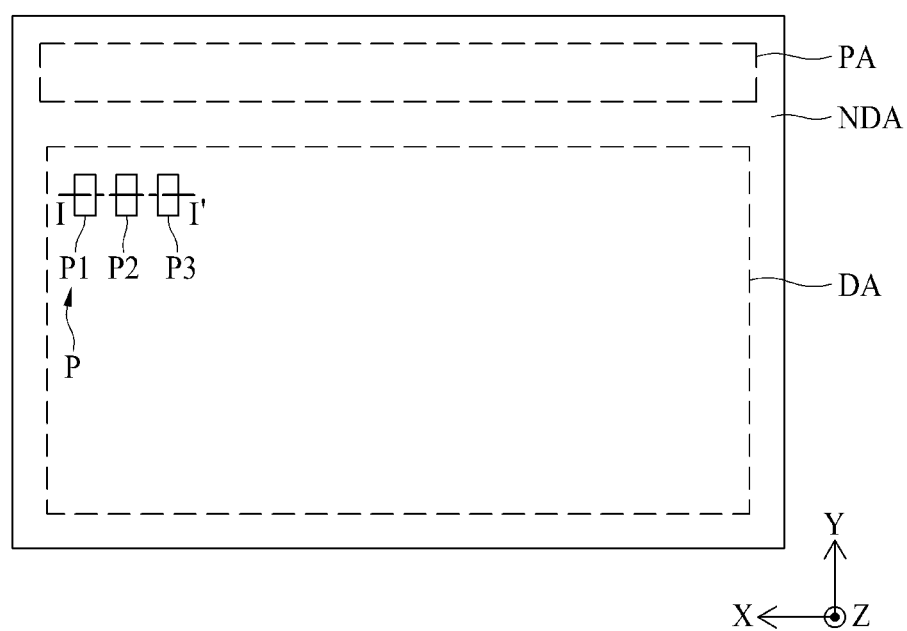
FIG. 2 is a plane view briefly illustrating a first substrate according to one embodiment of the present disclosure.
Figure 3:
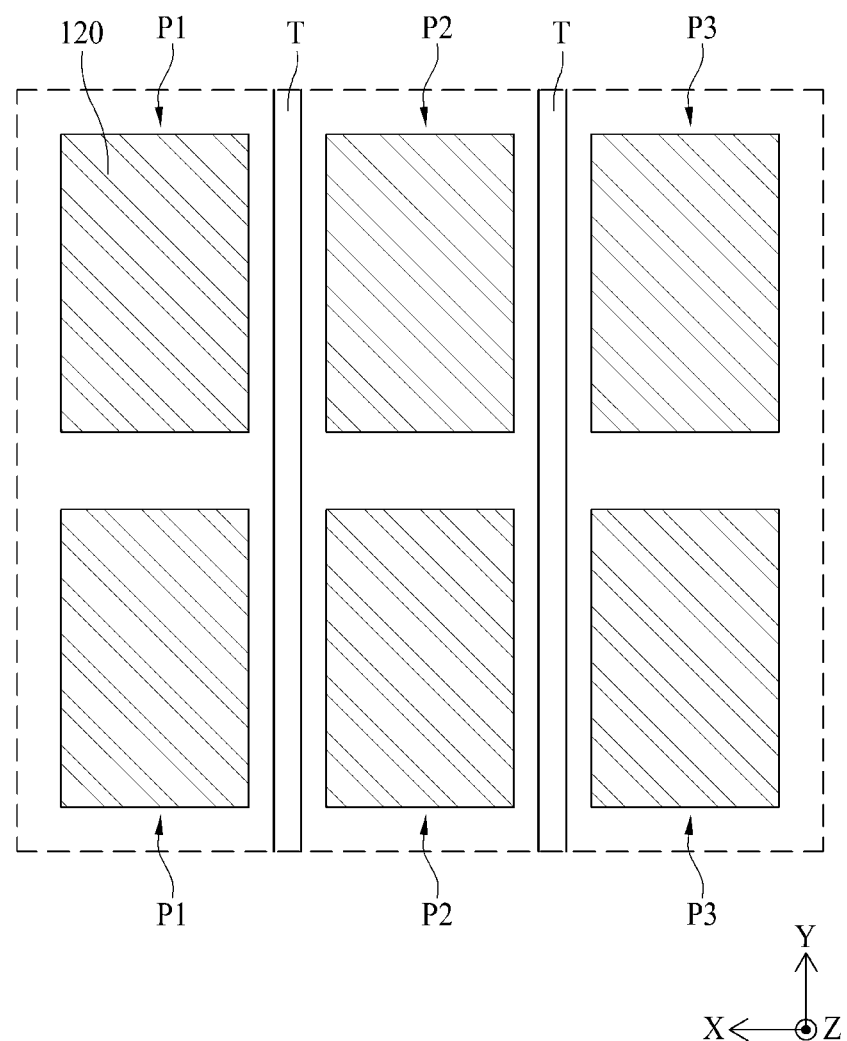
FIG. 3 is a plane view illustrating a trench arranged between subpixels according to one embodiment of the present disclosure.
Figure 4:
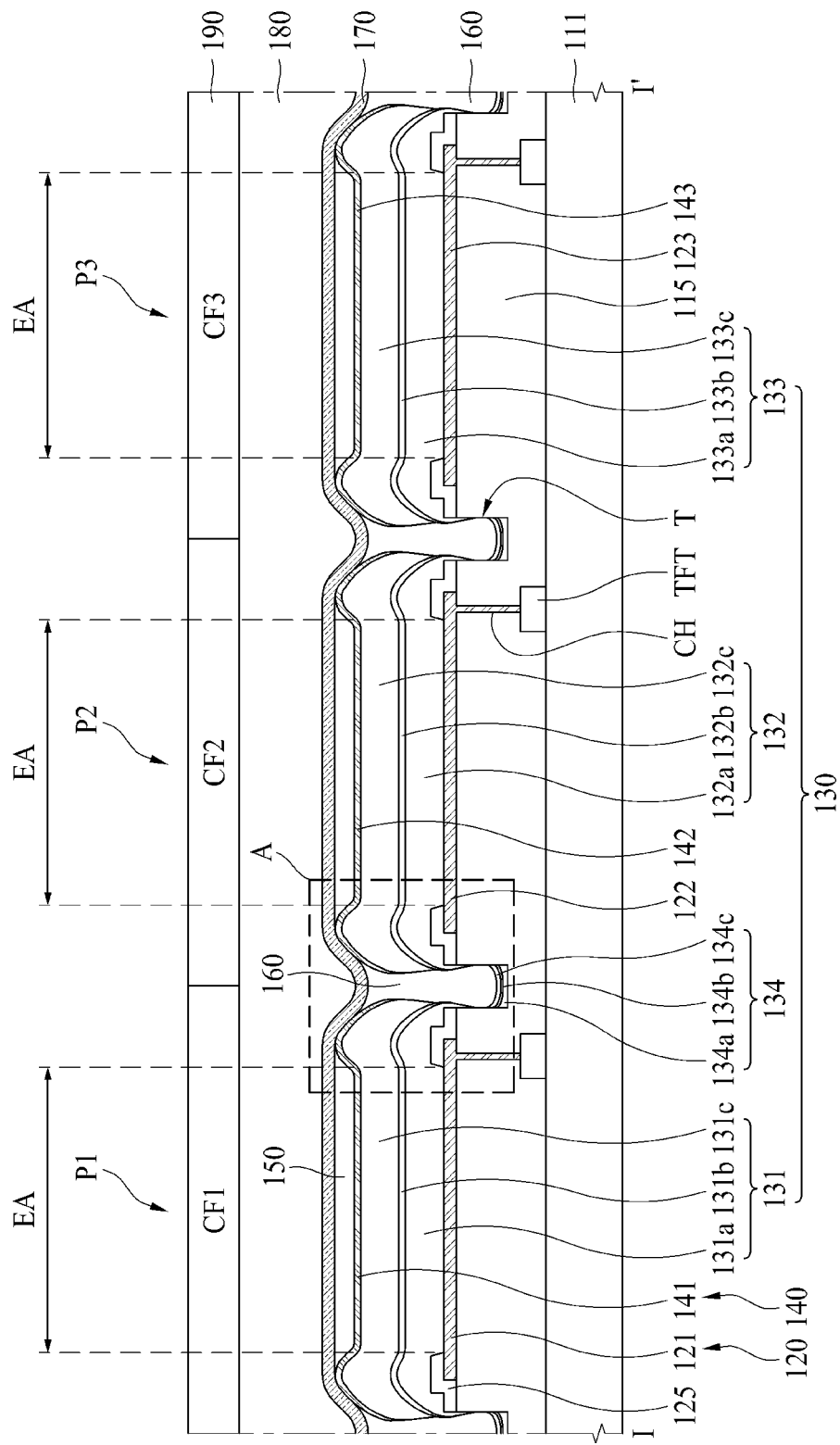
FIG. 4 is a cross-sectional view illustrating an example taken along line I-I' of FIG. 2 according to one embodiment of the present disclosure.
Figure 5:
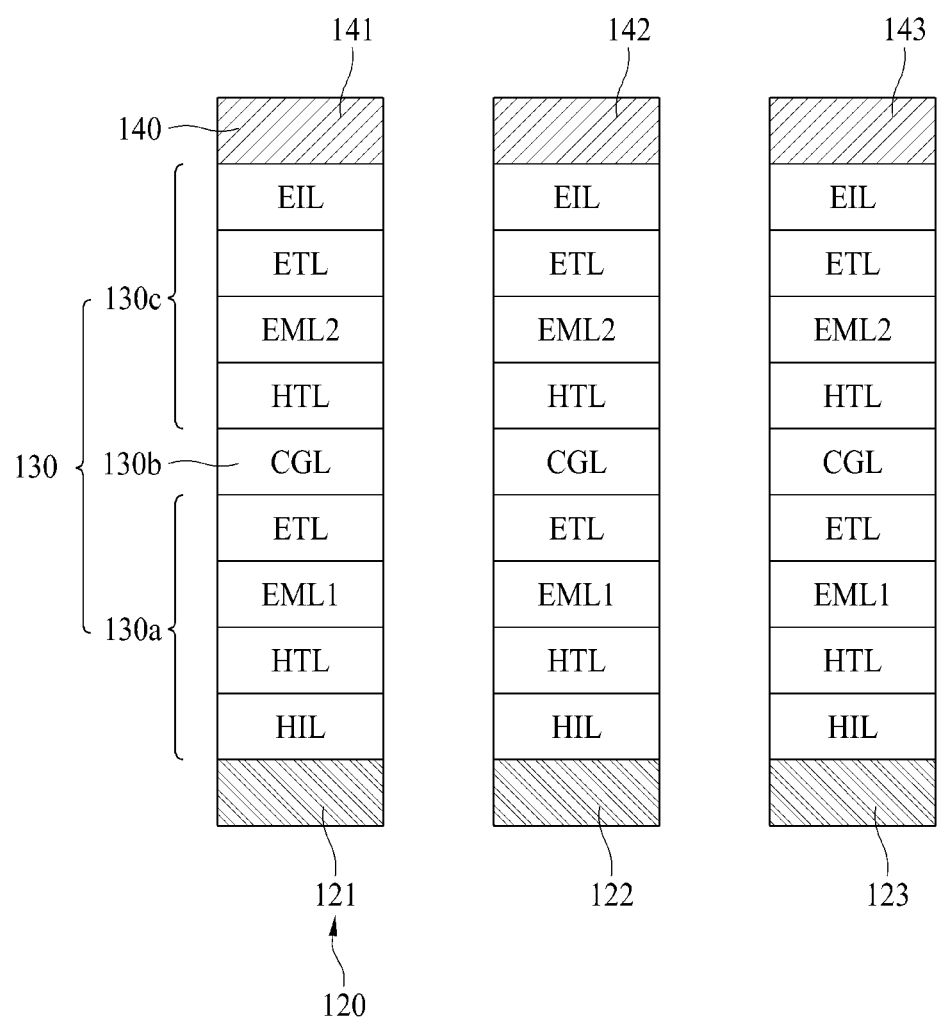
FIG. 5 is a detailed cross-sectional view illustrating an example of a first electrode, a light emitting layer, and a second electrode of a display device according to one embodiment of the present disclosure.
Figure 6:
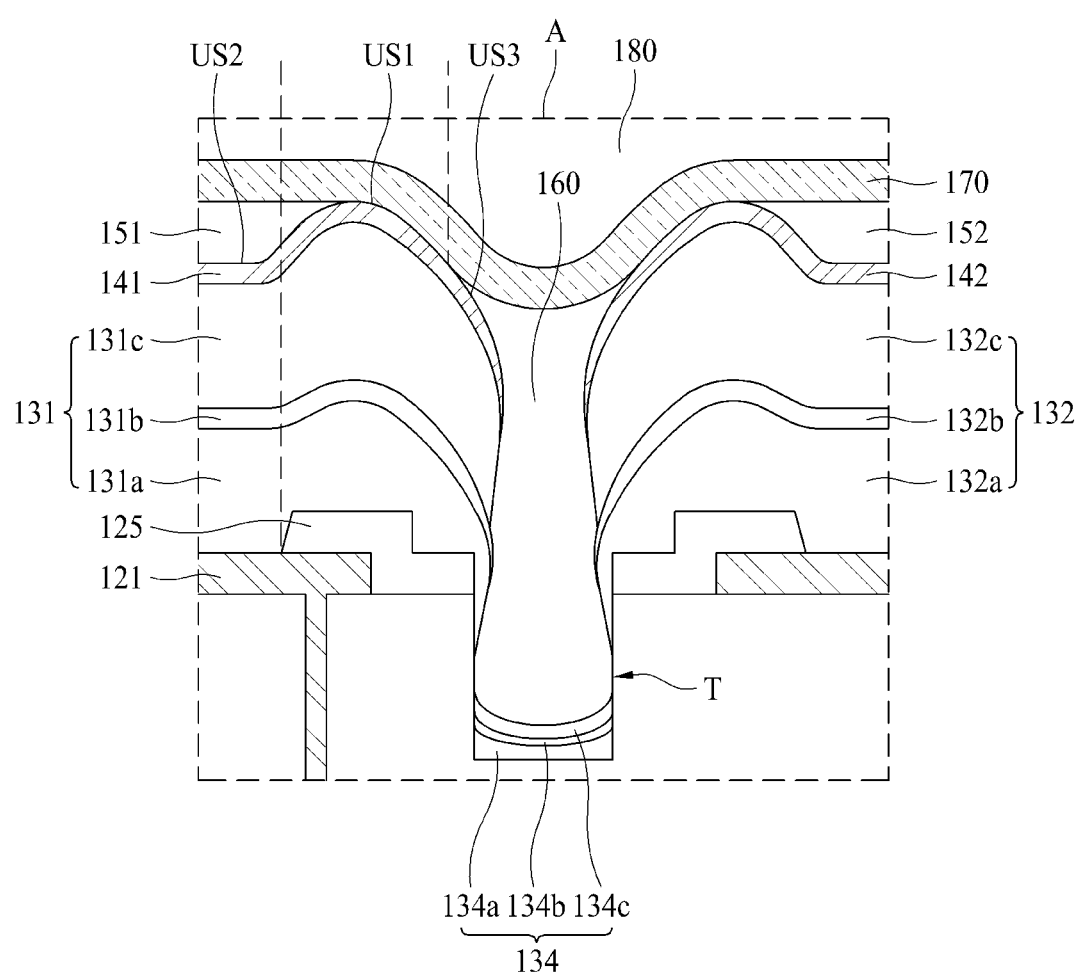
FIG. 6 is an enlarged view illustrating an area A of FIG. 4 according to one embodiment of the present disclosure.
Figure 7:
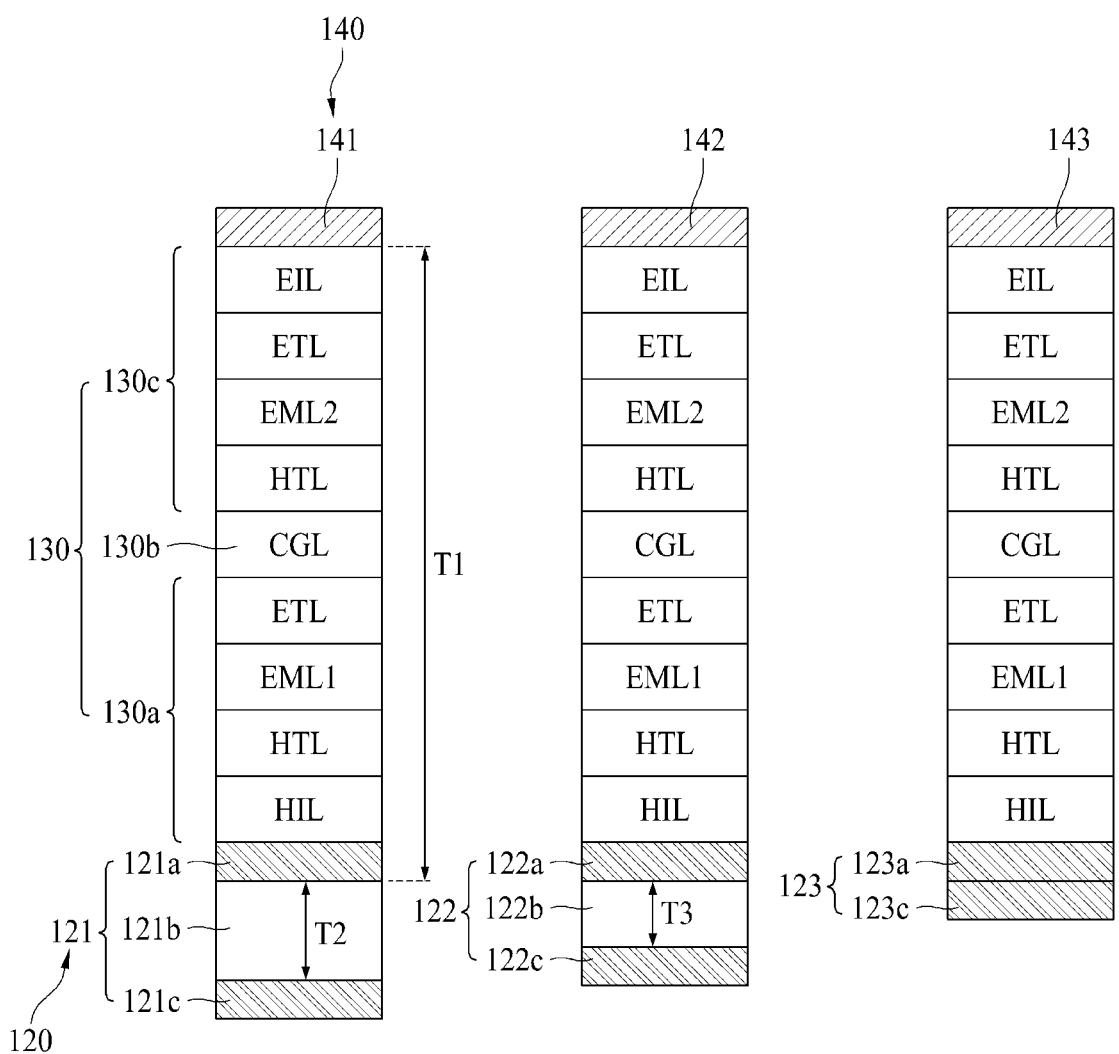
FIG. 7 is a cross-sectional view illustrating a modified example of FIG. 5 according to one embodiment of the present disclosure.

FIG. 2 is a plane view briefly illustrating a first substrate according to one embodiment of the present disclosure, FIG. 3 is a plane view illustrating a trench arranged between subpixels according to one embodiment of the present disclosure, FIG. 4 is a cross-sectional view illustrating an example taken along line I-I' of FIG. 2 according to one embodiment of the present disclosure, FIG. 5 is a detailed cross-sectional view illustrating an example of a first electrode, a light emitting layer, and a second electrode of a display device according to one embodiment of the present disclosure, FIG. 6 is an enlarged view illustrating an area A of FIG. 4 according to one embodiment of the present disclosure, and FIG. 7 is a cross-sectional view illustrating a modified example of FIG. 5 according to one embodiment of the present disclosure.

Referring to FIGS. 2 to 6, the first substrate 111 is divided into a display area DA and a non-display area NDA. In the non-display area NDA, there is a pad area PA for pads.

The data lines and the gate lines crossing the data lines may be provided in the display area DA. Pixels P displaying an image in a crossing area of the data line and the gate line may be provided in the display area DA.

The pixels P may include a first sub pixel P1, a second sub pixel P2, and a third sub pixel P3. The first sub pixel P1 is configured to emit red colored light, the second sub pixel P2 is configured to emit blue colored light, and the third sub pixel P3 is configured to emit green colored light, but not limited to this structure. A fourth sub pixel, which is configured to emit white colored light, may be provided in the display area DA of the first substrate 111.

If a gate signal is supplied from the gate line to each of the sub pixels P1, P2 and P3 a predetermined current is supplied to the light emitting device in accordance with a data voltage of the data line. Accordingly, the light emitting device for each of the sub pixels P1, P2, and P3 may emit light with a predetermined brightness in accordance with the predetermined current. In addition, the power lines supply a power voltage to each of the sub pixels P1, P2, and P3.

Referring to FIGS. 3 to 6, a thin film transistor TFT, an inter-layer dielectric film 115, a bank 125, a first electrode 120, a light emitting layer 130, a second electrode 140, a second insulating layer 150, a first insulating layer 160, a third electrode 170, an encapsulation film 180, a color filter 190, and a trench T are provided over one surface of a first substrate 111 facing a second substrate 112.

The first substrate 111 may be made of, but not limited to, glass or plastic. The first substrate 111 may be made of a semiconductor material such as silicon wafer. The first substrate 111 may be made of a transparent material or an opaque material.

The display device 100 according to one embodiment of the present disclosure may be formed in a top emission type where emitted light advances upward, but not limited to this type. If the display device 100 is formed in the top emission type where emitted light advances upward, the first substrate 111 may be formed of an opaque material as well as a transparent material. Meanwhile, the display device 100 according to one embodiment of the present disclosure is formed in a bottom emission type wherein emitted light advances downward, the first substrate 111 may be formed of a transparent material.

A circuit element which includes various signal lines, a thin film transistor and a capacitor is provided over the first substrate 111 for each of subpixels P1, P2, and P3. The signal lines may include a gate line, a data line, a power line, and a reference line. The thin film transistor may include a switching thin film transistor, a driving thin film transistor TFT and a sensing thin film transistor.

The switching thin film transistor is switched by a gate signal supplied to the gate line, and the switching thin film transistor supplies a data voltage, which is supplied from the data line, to the driving thin film transistor TFT.

The driving thin film transistor TFT is switched by the data voltage supplied from the switching thin film transistor, and the driving thin film transistor TFT generates a data current from power source supplied from the power line, and supplies the data current to the first electrode 120.

The sensing thin film transistor senses a deviation of threshold voltage in the driving thin film transistor TFT, which causes a deterioration of picture quality. The sensing thin film transistor supplies a current of the driving thin film transistor TFT to the reference line in response to a sensing control signal supplied from the gate line or an additional sensing line.

The capacitor maintains the data voltage supplied to the driving thin film transistor TFT for one frame period, and the capacitor is connected with each of gate and source terminals of the driving thin film transistor TFT.

The inter-layer dielectric film 115 is provided over the circuit element that includes the driving thin film transistor TFT. The inter-layer dielectric film 115 may be formed of an inorganic layer, and for example, may be formed of SiOx, SiNx, or a multilayer thereof. The inter-layer dielectric film 115 may be formed of an organic layer, and for example, may be formed of an acryl resin, an epoxy resin, a phenolic resin, a polyamide resin, or a polyimide resin. Alternatively, the inter-layer dielectric film 115 may be formed of a multiple layer composed of at least one inorganic layer and at least one organic layer.

The first electrode 120 is provided to be patterned over the inter-layer dielectric film for each of the subpixels P1, P2, and P3. One of the first electrode 121 is patterned in the first sub pixel P1, another first electrode 122 is patterned in the second sub pixel P2, and another first electrode 123 is patterned in the third sub pixel P3.

The first electrodes 121, 122, and 123 may be formed of a transparent metal material, a semi-transmissive metal material, or a metal material with high reflectance. If the display device 100 is formed in the top emission type, the first electrode 121, 122, and 123 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper (Cu), and etc. If the display device 100 is formed in the bottom emission type, the first electrodes 121, 122, and 123 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 121, 122, and 123 may be the anode electrode.

The first electrodes 121, 122, and 123 are connected to the driving thin film transistor TFT. In detail, the first electrodes 121, 122, and 123 are connected to a source terminal or a drain terminal of the driving thin film transistor TFT through a contact hole CH that passes through the inter-layer dielectric film 115, whereby a voltage for emitting light is applied to the first electrodes 121, 122, and 123.

The trench T is provided in the inter-layer dielectric film 115. The trench T is arranged among the subpixels P1, P2, and P3 as shown in FIG. 3.

In the present disclosure, as the trench T is provided among the subpixels P1, P2, and P3, a leakage current may be prevented from occurring among the subpixels P1, P2, and P3 adjacent to one another.

In more detail, the display device 100 according to one embodiment of the present disclosure may be provided with a tandem structure of two or more stacks in which two or more light emitting layers are deposited. In this case, two or more stacks may be provided as a common layer, whereby a current may leak toward adjacent subpixels in any one pixel. If a current leaks toward adjacent subpixels, in the display device 100, light may be emitted from an unwanted subpixel, whereby a color reproduction rate may be deteriorated.

This deterioration of the color reproduction rate occurs more greatly when a leakage current occurs between subpixels emitting light of different colors than the case that a leakage current occurs between subpixels emitting light of the same color. Therefore, it is important to prevent a leakage current from occurring between subpixels emitting light of different colors.

In order to prevent a leakage current from occurring between subpixels emitting light of different colors, in the display device 100 according to one embodiment of the present disclosure, the trench T may be arranged among the first, second, and third subpixels P1, P2, and P3 emitting light of different colors. Meanwhile, in the display device 100 according to one embodiment of the present disclosure, the trench T may not be arranged among the subpixels emitting light of the same color. However, the present disclosure is not limited to this case.

The first, second, and third subpixels P1, P2, and P3 emitting light of different colors may be arranged to be adjacent to one another in a first direction (X-axis direction). The subpixels emitting light of the same color may be arranged to be adjacent to one another in a second direction (Y-axis direction). The first subpixels P1 emitting light of a first color may be arranged to be adjacent to one another along the second direction (Y-axis direction). The second subpixels P2 emitting light of a second color may be arranged to be adjacent to one another along the second direction (Y-axis direction). At this time, the second subpixels P2 may be spaced apart from the first subpixels P1 in the first direction (X-axis direction). The third subpixels P3 emitting light of a third color may be arranged to be adjacent to one another along the second direction (Y-axis direction). At this time, the third subpixels P3 may be spaced apart from the second subpixels P2 in the first direction (X-axis direction).

At this time, the trench T may be provided between the first subpixel P1 and the second subpixel P2 and provided along the second direction (Y-axis direction) in a line shape. The trench T may be provided between the second subpixel P2 and the third subpixel P3 and provided along the second direction (Y-axis direction) in a line shape. Also, if the first subpixel P1 is arranged to be adjacent to the third subpixel P3, the trench T may be provided between the third subpixel P3 and the first subpixel P1 and provided along the second direction (Y-axis direction) in a line shape.

The trench T may be provided to be partially recessed but is not limited to this example. The trench T may be provided to pass through the inter-layer dielectric film 115. Hereinafter, the trench T indicates a portion where the inter-layer dielectric film 115 is recessed or penetrated through.

A width of the trench T may be designed considering a thickness of each of first stacks 131a, 132a, and 133a, charge generating layers 131b, 132b, and 133b and second stacks 131c, 132c, and 133c of the light emitting layer 130 and the second electrode 140.

In detail, the trench T may be designed to have a width such that the second electrode 140, the first stacks 131a, 132a, and 133a, the charge generating layers 131b, 132b, and 133b and the second stacks 131c, 132c, and 133c of the light emitting layer 130 may be disconnected, respectively, among the first subpixel P1, the second subpixel P2 and the third subpixel P3.

If the width of the trench T is small, the charge generating layers 131b, 132b, and 133b of the adjacent subpixels may be connected with each other. In detail, the trench T may be provided between the first subpixel P1 and the second subpixel P2, and the first stacks 131a, 132a, and 133a, of the light emitting layer 130, the charge generating layers 131b, 132b, and 133b and the second stacks 131c, 132c, and 133c may be deposited over the trench in due order. At this time, if a width W1 of the trench T is small, the first stack 131a deposited in the first subpixel P1 and the first stack 132a deposited in the second subpixel P2 may adjoin each other over the trench T. For this reason, the charge generating layers 131b and 132b deposited over the first stacks 131a and 132a may be connected to each other in the first subpixel P1 and the second subpixel P2, whereby a leakage current may occur between the adjacent subpixels P1 and P2.

Alternatively, even though the first stack 131*a* deposited at the first subpixel P1 and the first stack 132*a* deposited at the second subpixel P2 do not adjoin each other on the trench T, the charge generating layer 131*b* deposited at the first subpixel P1 and the charge generating layer 132*b* deposited at the second subpixel P2 may adjoin each other on the trench T. For this reason, the charge generating layers 131*b* and 132*b* may be connected to each other in the first subpixel P1 and the second subpixel P2, whereby a leakage current may occur between the adjacent subpixels P1 and P2.

On the other hand, if the width of the trench T is great, a light emission area EA and an opening ratio of the subpixels P1, P2, and P3 are reduced.

That is, the trench T may be designed at a minimum width such that the second electrode 140, the first stacks 131*a*, 132*a*, and 133*a*, the charge generating layers 131*b*, 132*b*, and 133*b* and the second stacks 131*c*, 132*c*, and 133*c* of the light emitting layer 130 may be disconnected, respectively, among the first subpixel P1, the second subpixel P2, and the third subpixel P3. At this time, an optimal width of the trench T may be varied depending on a thickness of each of the second electrode 140, the first stacks 131*a*, 132*a*, and 133*a* of the light emitting layer 130, the charge generating layers 131*b*, 132*b*, and 133*b* and the second stacks 131*c*, 132*c*, and 133*c*.

The bank 125 is provided over the inter-layer dielectric film 115. The bank 125 may be provided to overlay an end of each first electrodes 121, 122, and 123. Accordingly, it is possible to prevent a current from being concentrated on the end of each first electrode 121, 122, and 123, to thereby prevent a problem related with a deterioration of an emission efficiency.

As shown in FIG. 4, the bank 125 may be provided to overlay ends of the first electrodes 121, 122, and 123 respectively provided in the subpixels P1, P2, and P3 and expose the trench T provided among the subpixels P1, P2, and P3, but is not limited to this example.

In another embodiment, the bank 125 may be connected from an end of one first electrode 121 to an end of another one first electrode 122 and connected from an end of another one first electrode 122 to an end of the other one first electrode 123. That is, the bank 125 may be provided to overlay the ends of the first electrodes 121, 122, and 123 and at the same time overlay the trench T.

The bank 125 defines an emission area EA in each of a plurality of sub pixels P1, P2, and P3. That is, an exposed area of the first electrodes 121, 122, and 123 which are not overlaid with the bank 125 but exposed in each of the sub pixels P1, P2, and P3 is an emission area EA. On the other hand, the area except for the emission area EA is a non-emission area.

The bank 125 may be formed of an inorganic layer, and for example, may be formed of SiOx, SiNx, or a multilayer thereof. The bank 125 may be formed of an organic layer such as acryl resin, epoxy resin, phenolic resin, polyamide resin, polyimide resin, or the like.

The light emitting layer 130 is provided over the first electrodes 121, 122 and 123. The light emitting layer 130 may be a white light emitting layer emitting white light. In this case, the light emitting layer 130 may be a common layer commonly provided in the subpixels P1, P2, and P3.

The light emitting layer 130, as shown in FIG. 5, includes a first stack 130*a* emitting light of a first color, a second stack 130*c* emitting light of a second color, and a charge generating layer (CGL) 130*b* provided between the first stack 130*a* and the second stack 130*c*.

The first stack 130*a* is provided over the first electrodes 121, 122, and 123. The first stack 130*a* is disconnected among the subpixels P1, P2, and P3. In detail, the first stack 130*a* is disconnected between the first subpixel P1 and the second subpixel P2. For example, the first stack 130*a* may include, but is not limited to, the first stack 131*a* provided in the first subpixel P1, the first stack 132*a* provided in the second subpixel P2, and the first stack 134*a* provided in the trench T provided between the first subpixel P1 and the second subpixel P2. The first stack 131*a*, the first stack 132*a*, and the first stack 134*a*, as shown in FIGS. 4 and 6, may be disconnected from one another due to a step difference of the trench T. The first stack 131*a* provided in the first subpixel P1 and the first stack 132*a* provided in the second subpixel P2 do not adjoin with each other on the trench T.

Also, the first stack 130*a* is disconnected between the second subpixel P2 and the third subpixel P3. For example, the first stack 130*a* may include, but is not limited to, the first stack 132*a* provided in the second subpixel P2, the first stack 133*a* provided in the third subpixel P3, and the first stack 134*a* provided in the trench T provided between the second subpixel P2 and the third subpixel P3. At this time, the first stack 132*a* provided in the second subpixel P2, the first stack 133*a* provided in the third subpixel P3 and the first stack 134*a* provided in the trench T provided between the second subpixel P2 and the third subpixel P3, as shown in FIGS. 4 and 6, may be disconnected from one another due to a step difference of the trench T. The first stack 132*a* provided in the second subpixel P2 and the first stack 133*a* provided in the third subpixel P3 do not adjoin with each other on the trench T.

Although FIGS. 4 and 6 show that the first stack 130*a* is fully disconnected among the subpixels P1, P2, and P3, without limitation to this example, the first stack 130*a* may thinly be provided at a side of the trench T. The first stack 130*a* provided at the side of the trench T may become thin as it is to be close to the first substrate 111. At this time, the first stack 130*a* provided at the side of the trench T becomes thin and then disconnected, or may be connected with the first stack 130*a* provided over the bottom of the trench T.

The first stack 130*a* may be provided in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The charge generating layer 130*b* is provided over the first stack 130*a*. The charge generating layer 130*b* is disconnected among the subpixels P1, P2, and P3. In detail, the charge generating layer 130*b* is disconnected between the first subpixel P1 and the second subpixel P2. For example, the charge generating layer 130*b* may include, but is not limited to, a charge generating layer 131*b* provided in the first subpixel P1, a charge generating layer 132*b* provided in the second subpixel P2, and a charge generating layer 134*b* provided in the trench T provided between the first subpixel P1 and the second subpixel P2. At this time, the charge generating layer 131*b* provided in the first subpixel P1, the charge generating layer 132*b* provided in the second sub-pixel P2, and the charge generating layer 134*b* provided in the trench T provided between the first subpixel P1 and the second subpixel P2, as shown in FIGS. 4 and 6, may be disconnected from one another due to a step difference of the trench T. The charge generating layer 131b provided in the first subpixel P1 and the charge generating layer 132b provided in the second subpixel P2 do not adjoin each other on the trench T.

Also, the charge generating layer 130b is disconnected between the second subpixel P2 and the third subpixel P3. In detail, the charge generating layer 130b may include, but is not limited to, a charge generating layer 132b provided in the second subpixel P2, a charge generating layer 133b provided in the third subpixel P3, and a charge generating layer 134b provided in the trench T provided between the second subpixel P2 and the third subpixel P3. At this time, the charge generating layer 132b provided in the second subpixel P2, the charge generating layer 133b provided in the third subpixel P3 and the charge generating layer 134b provided in the trench T provided between the second subpixel P2 and the third subpixel P3, as shown in FIGS. 4 and 6, may be disconnected from one another due to a step difference of the trench T. The charge generating layer 132b provided in the second subpixel P2 and the charge generating layer 133b provided in the third subpixel P3 do not adjoin each other on the trench T.

Although FIGS. 4 and 6 show that the charge generating layer 130b is fully disconnected among the subpixels P1, P2, and P3, without limitation to this example, the charge generating layer 130b may thinly be provided at the side of the trench T. The charge generating layer 130b provided at the side of the trench T may become thin as it is to be close to the first substrate 111. At this time, the charge generating layer 130b provided at the side of the trench T becomes thin and then disconnected, or may be connected with the charge generating layer 130b provided over the bottom of the trench T. Even in this case, the charge generating layer 130b has high resistance as its thickness becomes thin in the trench T, whereby it is difficult to move charges through the charge generating layer 130b.

The charge generating layer 130b may be provided of a deposited structure of an N type charge generating layer for supplying electrons to the first stack 130a and a P type charge generating layer for supplying holes to the second stack 130c.

The second stack 130c is provided over the charge generating layer 130b. The second stack 130c is disconnected among the subpixels P1, P2, and P3. In detail, the second stack 130c is disconnected between the first subpixel P1 and the second subpixel P2. For example, the second stack 130c may include, but is not limited to, the second stack 131c provided in the first subpixel P1, the second stack 132c provided in the second subpixel P2, and the second stack 134c provided in the trench T provided between the first subpixel P1 and the second subpixel P2. At this time, the second stack 131c provided in the first subpixel P1, the second stack 132c provided in the second subpixel P2 and the second stack 134c provided in the trench T provided between the first subpixel P1 and the second subpixel P2, as shown in FIGS. 4 and 6, may be disconnected from one another due to a step difference of the trench T. The second stack 131c provided in the first subpixel P1 and the second stack 132c provided in the second subpixel P2 do not adjoin each other on the trench T.

Also, the second stack 130c is disconnected between the second subpixel P2 and the third subpixel P3. For example, the second stack 130c may include, but is not limited to, the second stack 132c provided in the second subpixel P2, the second stack 133c provided in the third subpixel P3, and the second stack 134c provided in the trench T provided between the second subpixel P2 and the third subpixel P3. At this time, the second stack 132c provided in the second subpixel P2, the second stack 133c provided in the third subpixel P3, and the second stack 134c provided in the trench T provided between the second subpixel P2 and the third subpixel P3, as shown in FIGS. 4 and 6, may be disconnected from one another due to a step difference of the trench T. The second stack 132c provided in the second subpixel P2 and the second stack 133c provided in the third subpixel P3 do not adjoin each other on the trench T.

Although FIGS. 4 and 6 show that the second stack 130c is fully disconnected among the subpixels P1, P2, and P3, without limitation to this example, the second stack 130c may thinly be provided at the side of the trench T. The second stack 130c provided at the side of the trench T may become thin as it is to be close to the first substrate 111. At this time, the second stack 130c provided at the side of the trench T becomes thin and then disconnected, or may be connected with the second stack 130c provided over the bottom of the trench T.

The second stack 130c may be provided in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

Since the charge generating layers 130b of the subpixels P1, P2, and P3 are disconnected from one another in the trench T, it is difficult to move charges through the charge generating layer 130b among the adjacent subpixels P1, P2, and P3.

The light emitting layer 130 according to one embodiment of the present disclosure may allow the adjacent subpixels P1, P2, and P3 to be affected by a leakage current within a minimum range.

Also, the light emitting layer 130 according to one embodiment of the present disclosure may be deposited at the subpixels P1, P2, and P3 without a separate mask at once.

The second electrode 140 is provided over the light emitting layer 130. The second electrode 140 is disconnected among the subpixels P1, P2, and P3. In detail, the second electrode 140 is disconnected between the first subpixel P1 and the second subpixel P2. For example, the second electrode 140 may include a second electrode 141 provided in the first subpixel P1 and a second electrode 142 provided in the second subpixel P2. The second electrode 141 provided in the first subpixel P1 and the second electrode 142 provided in the second subpixel P2, as shown in FIGS. 4 and 6, may be disconnected from each other due to a step difference of the trench T. The second electrode 141 provided in the first subpixel P1 and the second electrode 142 provided in the second subpixel P2 do not adjoin each other on the trench T.

Also, the second electrode 140 is disconnected between the second subpixel P2 and the third subpixel P3. For example, the second electrode 140 may include a second electrode 142 provided in the second subpixel P2 and a second electrode 143 provided in the third subpixel P3. The second electrode 142 provided in the second subpixel P2 and the second electrode 143 provided in the third subpixel P3, as shown in FIGS. 4 and 6, may be disconnected from each other due to a step difference of the trench T. The second electrode 142 provided in the second subpixel P2 and the second electrode 143 provided in the third subpixel P3 do not adjoin each other on the trench T.

The second electrode 140 may be formed of a transparent metal material, a semi-transmissive metal material, or a metal material with high reflectance. If the display device 100 is formed in the top emission type, the second electrode 140 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the second electrode 140 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper (Cu), and etc. The second electrode 140 may be a cathode electrode.

Meanwhile, the second electrode 140 may be formed by an evaporation method. If the second electrode 140 is formed by an evaporation method, the second electrode 140 is deposited over the light emitting layer 130 due to good linearity but is not deposited over a side of the light emitting layer 130. That is, the second electrode 140 formed by the evaporation method does not have good step coverage characteristic.

The display device 100 according to one embodiment of the present disclosure is characterized in that the second electrode 140 is formed not to obtain good step coverage characteristic. The charge generating layers 131b, 132b, and 133b of the light emitting layer 130 may be disconnected among the subpixels P1, P2 and P3 and partially exposed in the trench T. If the second electrode 140 is formed by a physical vapor deposition method such as sputtering, the second electrode 140 may be deposited over the charge generating layers 131b, 132b, and 133b due to good step coverage. For this reason, a short may occur between the second electrode 140 and the charge generating layers 131b, 132b, and 133b.

In order to prevent such a short from occurring, in the display device 100 according to one embodiment of the present disclosure, the second electrode 140 is formed by an evaporation method such that the second electrode 140 is not deposited over the side of the light emitting layer 130, particularly over the charge generating layers 131b, 132b, and 133b exposed to the side. As a result, in the display device 100 according to one embodiment of the present disclosure, a short may be prevented from occurring between the second electrode 140 and the charge generating layers 131b, 132b, and 133b of the light emitting layer 130.

Generally, a film deposited using a semi-transmissive metal material or a metal material of high reflexibility by an evaporation method has step coverage characteristic which is not better than a film deposited using a transparent metal material by an evaporation method. In the display device 100 according to one embodiment of the present disclosure, the second electrode 140 is formed of a semi-transmissive material or a metal material of high reflexibility, whereby step coverage characteristic of the second electrode 140 may be lowered. Therefore, in the display device 100 according to one embodiment of the present disclosure, the second electrode 140 does not adjoin the charge generating layers 131b, 132b, and 133b, whereby electric stability is obtained.

The second insulating layer 150 is provided over the second electrode 140. The second insulating layer 150 is provided over the second electrode 140 to partially expose the second electrode 140.

In detail, the second insulating layer 150 may directly be provided over an upper surface of the second electrode 140, and may partially expose the upper surface of the second electrode 140 in a non-light emitting area. The second electrode 140 may be provided with a first upper surface US1 which is convex from the first substrate 111 to the second substrate 112. The first upper surface US1 which is convex may be provided in the non-light emission area. Since the first upper surface US1 is generated by a step difference of the bank 125, the first upper surface US1 may be overlapped with an area where the bank 125 is provided. The first upper surface US1 has one end connected with a second upper surface US2 provided in the light emission area EA, and the other end connected to a third upper surface US3 inclined toward the trench T.

The second insulating layer 150, as shown in FIG. 6, may partially expose the first upper surface US1 of the second electrode 140, but is not limited to this example. The second insulating layer 150 may partially expose the convex first upper surface US1 and the inclined third upper surface US3 of the second electrode 140.

The second insulating layer 150 may be provided in each of the first to third subpixels P1, P2, and P3 emitting light of different colors. The second insulating layer 150 provided in each of the first to third subpixels P1, P2, and P3 may be spaced apart from another second insulating layer by interposing the trench T. For example, the second insulating layer 151 provided in the first subpixel P1 may be provided to partially expose the first upper surface US1 of the second electrode 141 provided in the first subpixel P1. The second insulating layer 152 provided in the second subpixel P2 may be provided to partially expose the first upper surface US1 of the second electrode 142 provided in the second subpixel P2. Therefore, the second insulating layer 151 provided in the first subpixel P1 and the second insulating layer 152 provided in the second subpixel P2 may be spaced apart from each other by interposing the trench T.

Meanwhile, the trench T may be provided between the subpixels emitting light of the same color. If the trench T is provided between the subpixels emitting light of the same color, the second insulating layer 150 provided in each of the subpixels emitting light of the same color may be spaced apart from another insulating layer by interposing the trench T.

On the other hand, the trench T may not be provided between the subpixels emitting light of the same color. If the trench T is not provided between the subpixels emitting light of the same color, the second insulating layer 150 provided in each of the subpixels emitting light of the same color may be connected with another insulating layer.

The second insulating layer 150 provided as described above is provided in the light emission area EA and increases light extraction effect. Also, the second insulating layer 150 is provided over the second electrode 140 to protect the second electrode 140 and the light emitting layer 130 from external water. The second insulating layer 150 serves as a capping layer.

The first insulating layer 160 is provided among the subpixels P1, P2, and P3. In detail, the first insulating layer 160 is provided among the light emitting layers 130 respectively provided in the subpixels P1, P2 and P3. The light emitting layers 130 respectively provided in the subpixels P1, P2 and P3 may be disconnected due to a step difference of the trench T. After the trench T is formed, the first stacks 131a, 132a and 133a, the charge generating layers 131b, 132b and 133b and the second stacks 131c, 132c and 133c may be formed in due order. The first stacks 131a, 132a and 133a, the charge generating layers 131b, 132b and 133b and the second stacks 131c, 132c and 133c may be disconnected among the subpixels P1, P2 and P3 due to a step difference of the trench T. At this time, the first stacks 131a, 132a and 133a respectively formed in the subpixels P1, P2 and P3 may be spaced apart from one another to form spaces among the subpixels P1, P2 and P3. The charge generating layers 131b, 132b and 133b respectively formed in the subpixels P1, P2 and P3 may be spaced apart from one another to form spaces among the subpixels P1, P2 and P3. Also, the second stacks 131c, 132c and 133c respectively formed in the subpixels P1, P2 and P3 may be spaced apart from one another to form spaces among the subpixels P1, P2 and P3.

The first insulating layer 160 is formed to fill the spaces provided among the subpixels P1, P2 and P3. Therefore, the first insulating layer 160 is arranged among the light emitting layers 130 respectively provided in the subpixels P1, P2, and P3 to insulate the light emitting layers 130 from one another. Particularly, in the display device 100 according to one embodiment of the present disclosure, the first insulating layer 160 is provided among the charge generating layers 131b, 132b and 133b of each of the subpixels P1, P2 and P3 to insulate the charge generating layers 131b, 132b and 133b from one another. Therefore, in the display device 100 according to one embodiment of the present disclosure, a current may more stably be prevented from leaking among the adjacent subpixels P1, P2 and P3 through the charge generating layers 131b, 132b, and 133b.

The first insulating layer 160 is provided among the second electrodes 141, 142 and 143 respectively provided in the subpixels P1, P2, and P3. The second electrodes 141, 142, and 143 respectively provided in the subpixels P1, P2, and P3 may be disconnected due to a step difference of the trench T. After the trench T is formed, the first stacks 131a, 132a and 133a, the charge generating layers 131b, 132b and 133b, the second stacks 131c, 132c and 133c and the second electrodes 141, 142 and 143 may be formed in due order. The first stacks 131a, 132a and 133a, the charge generating layers 131b, 132b and 133b and the second stacks 131c, 132c and 133c may be disconnected among the subpixels P1, P2 and P3 due to a step difference of the trench T. The second electrodes 141, 142 and 143 may also be disconnected among the subpixels P1, P2 and P3 due to a step difference of the trench T. At this time, the second electrodes 141, 142 and 143 respectively formed in the subpixels P1, P2 and P3 may be spaced apart from one another to form spaces among the subpixels P1, P2 and P3.

The first insulating layer 160 is formed to fill the spaces provided among the subpixels P1, P2 and P3. At this time, the first insulating layer 160 may partially overlay the inclined third upper surface US3 of the second electrodes 141, 142 and 143 respectively provided in the subpixels P1, P2 and P3.

The first insulating layer 160 is arranged among the second electrodes 141, 142 and 143 respectively provided in the subpixels P1, P2 and P3 to insulate the second electrodes 141, 142 and 143 from one another. In the display device 100 according to one embodiment of the present disclosure, the second electrodes 141, 142 and 143 may more stably be prevented from adjoining the charge generating layers 131b, 132b and 133b.

The first insulating layer 160 may be made of the same material as that of the second insulating layer 150, and may be formed by the same process as that of the second insulating layer 150.

In detail, in order to form the first and second insulating layers 150 and 160, first of all, an insulating material may be deposited over the second electrode 140. The insulating material may be deposited over the first upper surface US1, the second upper surface and the third upper surface US3 of the second electrodes 141, 142 and 143. At this time, since the insulating material has great viscosity, the insulating material may fail to fill the spaces among the subpixels P1, P2 and P3. The spaces among the subpixels P1, P2 and P3 mean spaces provided by disconnection of the light emitting layer 130 and disconnection of the second electrode in the trench T.

Moreover, the light emitting layers 131, 132 and 133 and the second electrodes 141, 142 and 143 are formed in due order, whereby the spaces among the subpixels P1, P2 and P3 may be narrower. Since the insulating material fails to sufficiently enter the narrow spaces among the subpixels P1, P2 and P3, the spaces among the subpixels P1, P2 and P3 may not be filled by the insulating material completely. Therefore, the insulating material may not cover the charge generating layers 131b, 132b and 133b exposed from the trench T.

If the first substrate 111 deposited with the insulating material is heated, a temperature of the insulating material is increased and its viscosity may be reduced. Particularly, if the temperature of the insulating material becomes greater than a glass transition temperature Tg or a melting point Tm, viscosity of the insulating material is lowered and has flexibility. The insulating material having flexibility flows along the inclined third upper surface US3 of the second electrode 140. Therefore, the insulating material is filled in the space provided by disconnection of the light emitting layer 130 and disconnection of the second electrode 140 in the trench T.

Also, the insulating material deposited over the first upper surface US1 of the second electrode 140 flows to the second upper surface US2 or the third upper surface US3 along the inclined surface. Therefore, at least a portion of the first upper surface US1 of the second electrode 140 is exposed.

Consequently, the insulating material is arranged over the second upper surface US2 of the second electrode 140, and in the space provided by disconnection of the light emitting layer 130 and disconnection of the second electrode 140 in the trench T. The insulating material arranged over the second upper surface US2 of the second electrode 140 becomes the second insulating layer 150 and serves as a capping layer. The insulating material arranged in the spaces among the subpixels P1, P2, and P3 becomes the first insulating layer 160 and prevents a current from leaking among the adjacent subpixels P1, P2 and P3.

The third electrode 170 is provided over the second insulating layer 150 and the first insulating layer 160. The third electrode 170 may be a common layer connected among the subpixels P1, P2, and P3 and commonly provided.

At this time, the third electrode 170 is also provided over a portion of the second electrode 140 exposed without being covered by the first insulating layer 160 and the second insulating layer 150. In detail, the upper surface of the second electrode 140 is partially exposed for each of the subpixels P1, P2, and P3 without being covered by the second insulating layer 150 and the first insulating layer 160. The third electrode 170 is electrically connected with the second electrodes 141, 142, and 143 respectively provided in the subpixels P1, P2, and P3. Also, the second electrodes 141, 142, and 143 respectively provided in the subpixels P1, P2, and P3 are electrically connected with one another through the third electrode 170. The same voltage is applied to the second electrodes 141, 142 and 143 and the third electrode 170.

Although FIG. 4 shows that the third electrode 170 is a common layer commonly provided for the subpixels P1, P2, and P3, the third electrode 170 is not limited to the example of FIG. 4. In another embodiment, the third electrode 170 may be an electrode pattern provided among the subpixels P1, P2, and P3. In detail, one third electrode 170 may be an electrode pattern where its one end contacts the exposed upper surface of the second electrode 141 provided in the first subpixel P1, and its other end contacts the exposed upper surface of the second electrode 142 provided in the second subpixel P2. Therefore, the third electrode 170 may be a connection pattern for electrically connecting the second electrode 141 of the first subpixel P1 with the second electrode 142 of the second subpixel P2.

Also, the other third electrode 170 may be an electrode pattern where its one end contacts the exposed upper surface of the second electrode 142 provided in the second subpixel P2, and its other end contacts the exposed upper surface of the second electrode 143 provided in the third subpixel P3. Therefore, the third electrode 170 may be a connection pattern for electrically connecting the second electrode 142 of the second subpixel P2 with the second electrode 143 of the third subpixel P3.

The third electrode 170 may be formed of a transparent metal material, a semi-transmissive metal material, or a metal material with high reflectance. If the display device 100 is formed in the top emission type, the third electrode 170 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the third electrode 170 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper (Cu), and etc. The third electrode 170 may be a cathode electrode.

Meanwhile, the third electrode 170 may be formed by, but not limited to, a physical vapor deposition method such as sputtering. The third electrode 170 may be formed by an evaporation method in the same manner as the second electrode 140. A film formed by the physical vapor deposition method such as sputtering has excellent step coverage characteristic. Therefore, the third electrode 170 may be deposited over the second insulating layer 150, the first insulating layer 160 and the exposed second electrode 140 at a uniform thickness.

In the display device 100 according to the present disclosure, the second electrodes 141, 142, and 143 disconnected among the subpixels P1, P2, and P3 may be connected with one another through the third electrode 170 to connect the second electrodes (e.g., cathode electrode). If the third electrode 170 is not provided, a width of the trench T may be designed such that the second electrode 140 is not disconnected among the subpixels P1, P2, and P3. However, the second electrode 140 may be disconnected among the subpixels P1, P2, and P3 due to a step difference of the trench T, whereby connection of the second electrode (e.g., cathode electrode) may be unstable due to a process error.

In the display device 100 according to the present disclosure, a separate third electrode 170 may be used to prevent connection of the second electrode (e.g., cathode electrode) from being unstable due to a process error, and connection of the second electrode (e.g., cathode electrode) may be ensured.

The encapsulation film 180 may be provided to overlay the third electrode 170. The encapsulation film 180 serves to prevent oxygen or water from being permeated into the second electrode 140 and the third electrode 170. To this end, the encapsulation film 180 may include at least one inorganic film and at least one organic film.

In detail, the encapsulation film 180 may include a first inorganic film and an organic film. In one embodiment, the encapsulation film 180 may further include a second inorganic film.

The first inorganic film is provided to overlay the third electrode 170. The organic film is provided over the first inorganic film. It is preferable that the organic film is formed at a sufficient thickness to prevent particles from being permeated into the light emitting layer 130, the second electrode 140 and the third electrode 170 by passing through the first inorganic film. The second inorganic film is provided to overlay the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be obtained by a vapor deposition method, a printing method, or a slit coating method, but not limited to these methods. The organic film may be obtained by an ink-jet method.

The color filter 190 is provided over the encapsulation film 180. The color filter 190 includes a first color filter CF1, a second color filter CF2, and a third color filter CF3, which are arranged to respectively correspond to the subpixels P1, P2, and P3. The first color filter CF1 may be a red color filter transmitting red light, the second color filter CF2 may be a green color filter transmitting green light, and the third color filter CF3 may be a blue color filter transmitting blue light.

Meanwhile, although FIG. 5 shows that the first electrode 120 includes one layer, the present disclosure is not limited to this example of FIG. 5.

In another embodiment, the first electrode 120 may include a plurality of layers as shown in FIG. 7. In more detail, the first electrode 121 provided in the first subpixel P1 may include a first upper electrode 121a, a first lower electrode 121c, and a first dielectric layer 121b provided between the first upper electrode 121a and the first lower electrode 121c.

The first upper electrode 121a is electrically connected with a source terminal or drain terminal of the aforementioned driving thin film transistor TFT. In detail, the first upper electrode 121a may directly be connected with the source terminal or drain terminal of the driving thin film transistor TFT, and may be connected with the source terminal or drain terminal of the driving thin film transistor TFT through the first lower electrode 121c, as well. Therefore, the first upper electrode 121a may be connected with the first lower electrode 121c through a contact hole (not shown) provided in the first dielectric layer 121b but is not limited to this example. The first upper electrode 121a may not be connected with the first lower electrode 121c. The first lower electrode 121c may serve as a reflective electrode but may not serve as an anode that generates holes. Therefore, the first lower electrode 121c may not be always connected with the first upper electrode 121a.

The first lower electrode 121c may be comprised of a reflective electrode that reflects light emitted from the light emitting layer 130 toward an upper portion, and the first upper electrode 121a may be comprised of a transparent electrode for generating holes. Meanwhile, the second electrode 141 may be comprised of a semi-transmissive electrode. Therefore, reflection and re-reflection of light may occur between the first lower electrode 121c comprised of the reflective electrode and the second electrode 141 comprised of the semi-transmissive electrode, whereby microcavity effect may be obtained.

At this time, the reflective electrode is an electrode that reflects incident light, transparent electrode is an electrode that transmits incident light, and the semi-transmissive electrode is an electrode that transmits a portion of incident light and reflects the other portion of incident light. Transparency may be more excellent in the order of the reflective electrode, the semi-transmissive electrode and the transparent electrode, and reflectance may be more excellent in the order of the transparent electrode, the semi-transmissive electrode and the reflective electrode.

If a distance (T1+T2) between the first lower electrode 121c and the second electrode 141 reaches an integer multiple of a half wavelength $\lambda/2$ of light of a red wavelength, reinforcing interference occurs to amplify the light of the red wavelength, and if the aforementioned reflection and re-reflection are repeated, an amplified level of the light of the red wavelength may continuously be increased.

At this time, the first dielectric layer 121b provided between the first lower electrode 121c and the first upper electrode 121a is intended such that the distance (T1+T2) between the first lower electrode 121c and the second electrode 141 may reach an integer multiple of a half wavelength $\lambda/2$ of the light of the red wavelength. To this end, a second thickness T2 of the first dielectric layer 121b may be controlled appropriately. The first dielectric layer 121b may be made of a transparent material such as silicon oxide, silicon nitride, ITO or IZO.

The first distance T1 from the lower surface of the first upper electrode 121a to the lower surface of the second electrode 141 in the first subpixel P1 is equal to the first distance T1 from the lower surface of the third upper electrode 123a to the lower surface of the second electrode 143 in the third subpixel P3.

The first electrode 122 provided in the second subpixel P2 may include a second upper electrode 122a, a second lower electrode 122c, and a second dielectric layer 122b provided between the second upper electrode 122a and the second lower electrode 122c.

The second upper electrode 122a is electrically connected with the source terminal or drain terminal of the aforementioned driving thin film transistor TFT. In detail, the second upper electrode 122a may directly be connected with the source terminal or drain terminal of the driving thin film transistor TFT, and may be connected with the source terminal or drain terminal of the driving thin film transistor TFT through the second lower electrode 122c, as well. Therefore, the second upper electrode 122a may be connected with the second lower electrode 122c through a contact hole (not shown) provided in the second dielectric layer 122b but is not limited to this example. The second upper electrode 122a may not be connected with the second lower electrode 122c. The second lower electrode 122c may serve as a reflective electrode but may not serve as an anode that generates holes. Therefore, the second lower electrode 122c may not be always connected with the second upper electrode 122a.

The second lower electrode 122c may be comprised of a reflective electrode that reflects light emitted from the light emitting layer 130 toward an upper portion, and the second upper electrode 122a may be comprised of a transparent electrode for generating holes. Meanwhile, the second electrode 142 may be comprised of a semi-transmissive electrode. Therefore, reflection and re-reflection of light may occur between the second lower electrode 122c comprised of the reflective electrode and the second electrode 142 comprised of the semi-transmissive electrode, whereby microcavity effect may be obtained. The second lower electrode 122c may be made of the same material as that of the first lower electrode 121c, and the second upper electrode 122a may be made of the same material as that of the first upper electrode 121a.

If a distance (T1+T3) between the second lower electrode 122c and the second electrode 142 reaches an integer multiple of a half wavelength $\lambda/2$ of light of a green wavelength, reinforcing interference occurs to amplify the light of the green wavelength, and if the aforementioned reflection and re-reflection are repeated, an amplified level of the light of the green wavelength may continuously be increased.

At this time, the second dielectric layer 122b provided between the second lower electrode 122c and the second upper electrode 122a is intended such that the distance (T1+T3) between the second lower electrode 122c and the second electrode 142 may reach an integer multiple of a half wavelength $\lambda/2$ of the light of the green wavelength. To this end, a third thickness T3 of the second dielectric layer 122b may be controlled appropriately. The second dielectric layer 122b may be made of the same material as that of the first dielectric layer 121b.

The first distance T1 from the lower surface of the second upper electrode 122a to the lower surface of the second electrode 142 in the second subpixel P2 is equal to the first distance T1 from the lower surface of the third upper electrode 123a to the lower surface of the second electrode 143 in the third subpixel P3.

The first electrode 123 provided in the third subpixel P3 may include a third upper electrode 123a and a third lower electrode 123c.

The third upper electrode 123a is electrically connected with the source terminal or drain terminal of the aforementioned driving thin film transistor TFT. In detail, the third upper electrode 123a may directly be connected with the source terminal or drain terminal of the driving thin film transistor TFT, and may be connected with the source terminal or drain terminal of the driving thin film transistor TFT through the third lower electrode 123c, as well. Although the third upper electrode 123a may be provided over the upper surface of the third lower electrode 123c, a third dielectric layer may additionally be provided between the third upper electrode 123a and the third lower electrode 123c.

The third lower electrode 123c may be comprised of a reflective electrode that reflects light emitted from the light emitting layer 130 toward an upper portion, and the third upper electrode 123a may be comprised of a transparent electrode for generating holes. Meanwhile, the second electrode 143 may be comprised of a semi-transmissive electrode. Therefore, reflection and re-reflection of light may occur between the third lower electrode 123c comprised of the reflective electrode and the second electrode 143 comprised of the semi-transmissive electrode, whereby microcavity effect may be obtained. The third lower electrode 123c may be made of the same material as that of the first lower electrode 121c or the second lower electrode 122c, and the third upper electrode 123a may be made of the same material as that of the first upper electrode 121a or the second upper electrode 122a.

If a first distance T1 between the third lower electrode 123c and the second electrode 143 reaches an integer multiple of a half wavelength λ/2 of light of a blue wavelength, reinforcing interference occurs to amplify the light of the blue wavelength, and if the aforementioned reflection and re-reflection are repeated, an amplified level of the light of the blue wavelength may continuously be increased.

In the display device 100 according to one embodiment of the present disclosure, the second electrodes 141, 142, and 143 may be formed by depositing a semi-transmissive material using an evaporation method. A film deposited using a semi-transmissive metal material by an evaporation method does not have good step coverage characteristic. Since the second electrodes 141, 142, and 143 which are deposited do not have good step coverage characteristic, the second electrodes are not deposited at the space provided as the light emitting layer 130 is disconnected by the trench T. Therefore, in the display device 100 according to one embodiment of the present disclosure, the second electrodes 141, 142, and 143 do not adjoin the charge generating layers 131b, 132b and 133b, whereby electric stability may be obtained.

In the display device 100 according to one embodiment of the present disclosure, reflection and re-reflection of light may occur between the second electrodes 141, 142, and 143 comprised of the semi-transmissive electrodes and the lower electrodes 121c, 122c, and 123c, whereby microcavity effect may be obtained. Therefore, in the display device 100 according to one embodiment of the present disclosure, light of different wavelengths may be emitted from each of the first to third subpixels P1, P2, and P3.

Figure 8:
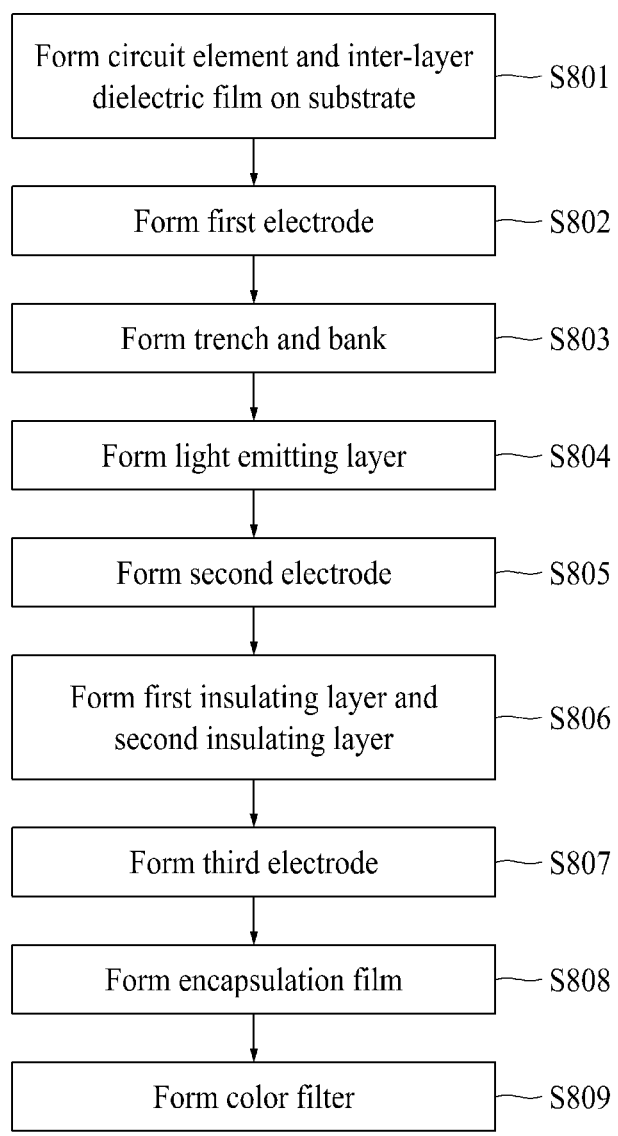
FIG. 8 is a flow chart illustrating a manufacturing method of a display device according to one embodiment of the present disclosure.

FIG. 8 is a flow chart illustrating a manufacturing method of a display device according to one embodiment of the present disclosure, and FIGS. 9A to 9L are cross-sectional views illustrating a manufacturing method of a display device according to one embodiment of the present disclosure.

First of all, the circuit element and the inter-layer dielectric film 115 are formed over the substrate 111 (S801).

Figure 9A:
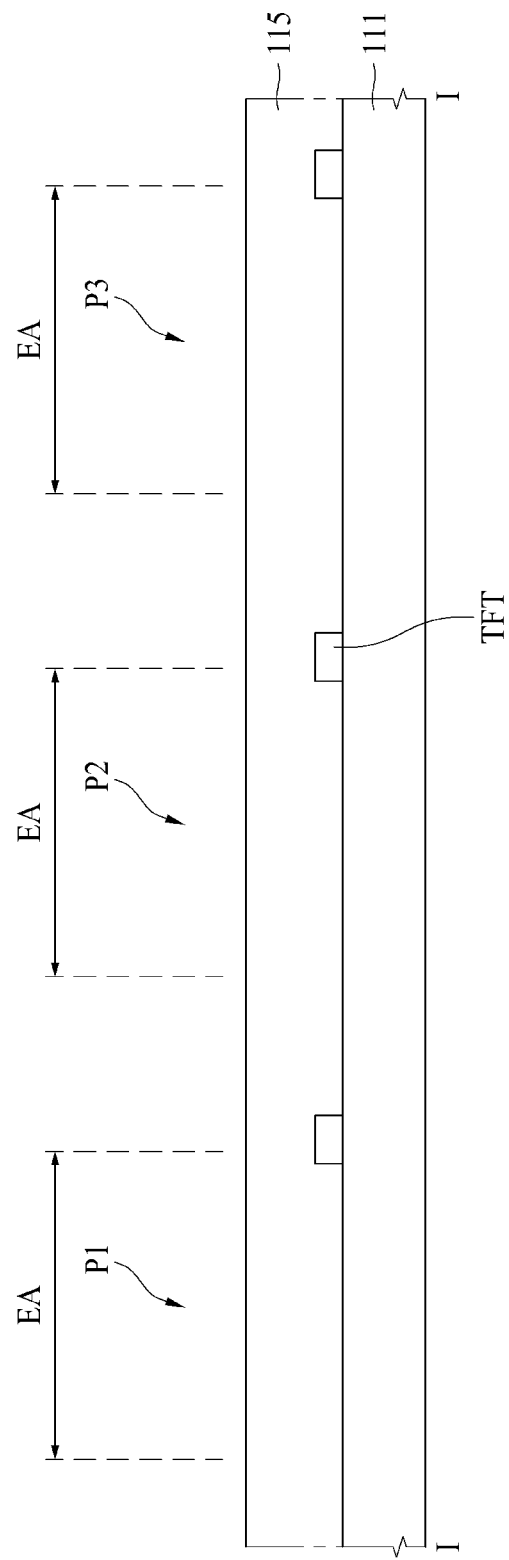

In more detail, as shown in FIG. 9A, the driving thin film transistor TFT is formed over the substrate 111. Then, the inter-layer dielectric film 115 is formed over the driving thin film transistor TFT. The inter-layer dielectric film 115 may be formed of an inorganic layer, and for example, may be formed of SiOx, SiNx, or a multilayer thereof.

The inter-layer dielectric film 115 may be formed of an organic layer, and for example, may be formed of an acryl resin, an epoxy resin, a phenolic resin, a polyamide resin, or a polyimide resin. Alternatively, the inter-layer dielectric film 115 may be formed of a multiple layer composed of at least one inorganic layer and at least one organic layer.

Then, the first electrode 120 is formed (S802). In more detail, as shown in FIG. 9B, the first electrodes 121, 122, and 123 are formed over the inter-layer dielectric film 115 and patterned for each of the subpixels P1, P2, and P3. The first electrode 120 is connected to the source terminal or the drain terminal of the driving thin film transistor TFT through a contact hole CH that passes through the inter-layer dielectric film 115.

The first electrode 121, 122, and 123 may be formed of a transparent metal material, a semi-transmissive metal material, or a metal material with high reflectance. If the display device 100 is formed in the top emission type, the first electrode 121, 122, and 123 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper (Cu), and etc. If the display device 100 is formed in the bottom emission type, the first electrode 121, 122, and 123 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 121, 122, and 123 may be the anode electrode.

Figure 9C:
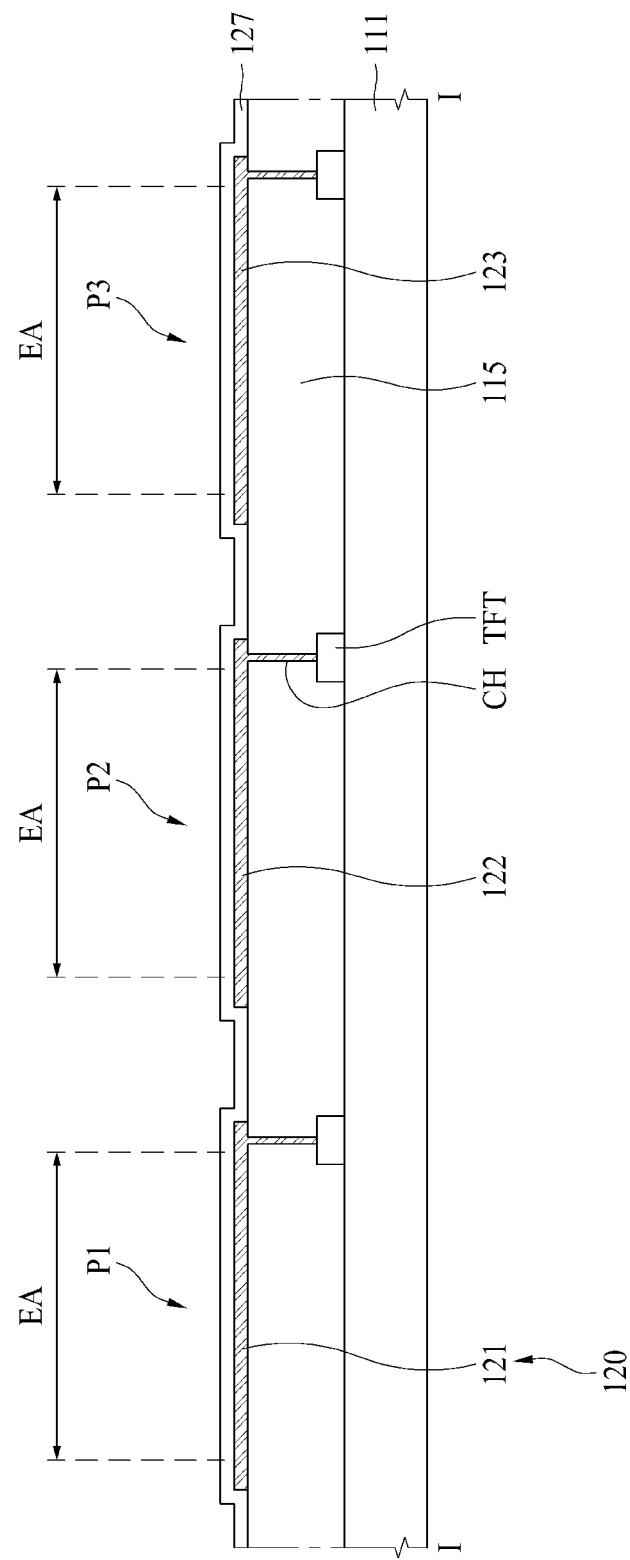

Next, the bank 125 and the trench T are formed (S803). In more detail, as shown in FIG. 9C, a bank material 127 constituting the bank 125 is deposited over the inter-layer dielectric film 115 and the first electrode 120.

Figure 9D:
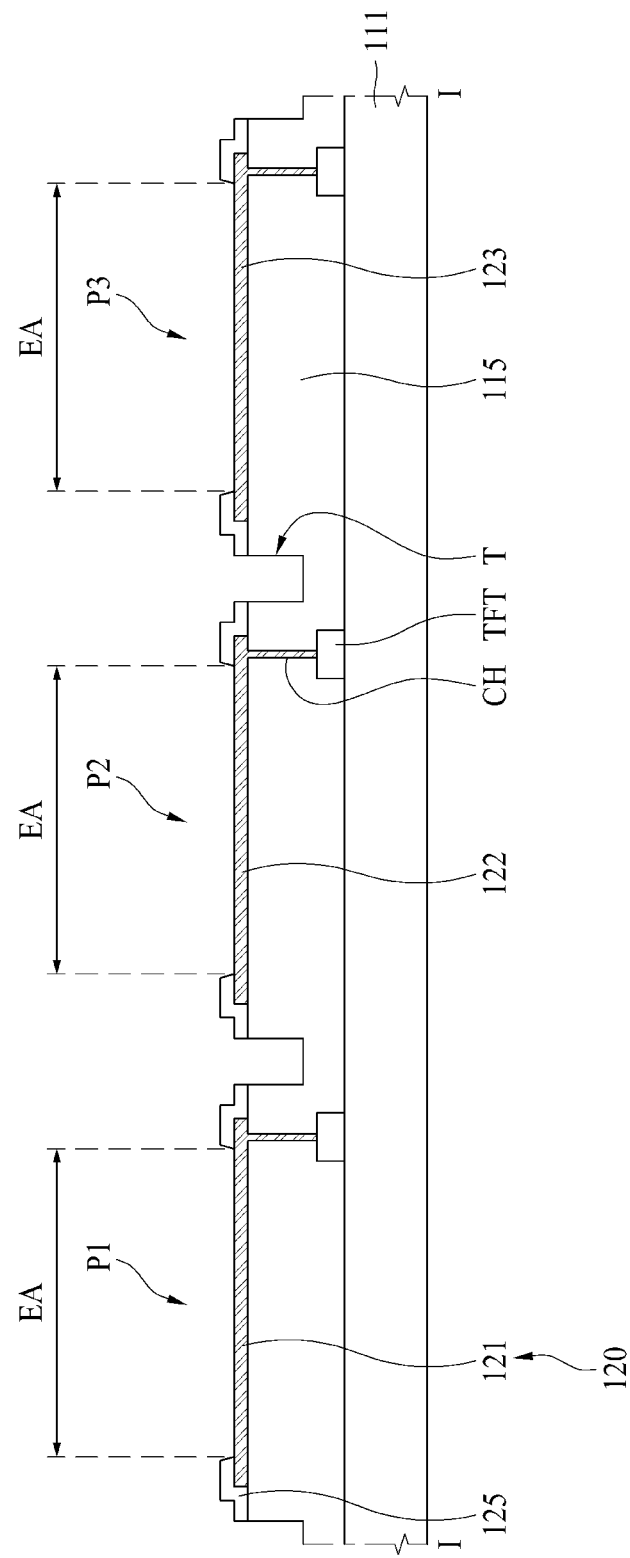

Then, as shown in FIG. 9D, the trench T is formed in the inter-layer dielectric film 115 by performing an etching process. The trench T may be formed among the subpixels P1, P2, and P3 by partially removing the inter-layer dielectric film 115 to be recessed but is not limited to this example. The trench T may be formed to pass through the inter-layer dielectric film 115.

The trench T is formed among the first, second, and third subpixels P1, P2, and P3 emitting light of different colors. The trench T may not be arranged among the first, second, and third subpixels P1, P2, and P3 emitting light of the same color, but is not limited to this example. The trench T may be arranged among the first, second, and third subpixels P1, P2, and P3 emitting light of the same color. Also, as shown in FIG. 9D, the bank 125 is formed by partially removing the bank material 127 deposited over the first electrode 120. As a result, the bank 125 is formed to overlay ends of each of the first electrodes 121, 122, and 123 and expose the trench T formed among the subpixels P1, P2 and P3.

The bank 125 may be formed of an inorganic layer, and for example, may be formed of SiOx, SiNx, or a multilayer thereof. The bank 125 may be formed of an organic layer such as acryl resin, epoxy resin, phenolic resin, polyamide resin, polyimide resin, or the like.

Meanwhile, the trench T is formed after the first electrode 120 is formed in the description of FIG. 9D, but the trench T is not limited to the example of FIG. 9D. In another embodiment, after the inter-layer dielectric film 115 is formed, the trench T may be formed before the first electrode 120 is formed. In detail, the trench T may be formed together with the contact hole CH that exposes the driving thin film transistor TFT by passing through the inter-layer dielectric film 115 after the inter-layer dielectric film 115 is formed.

Also, the trench T is formed after the bank material 127 is deposited in the description of FIG. 9D, but the trench T is not limited to the example of FIG. 9D. In another embodiment, the trench T may be formed before the bank material 127 is deposited after the first electrode 120 is formed. In this case, after the trench T is formed, the bank material 127 is deposited over the trench T, the first electrode 120 and the inter-layer dielectric film 115. Then, the bank material 127 deposited over the first electrode 120 may partially be removed to form the bank 125.

Figure 9E:
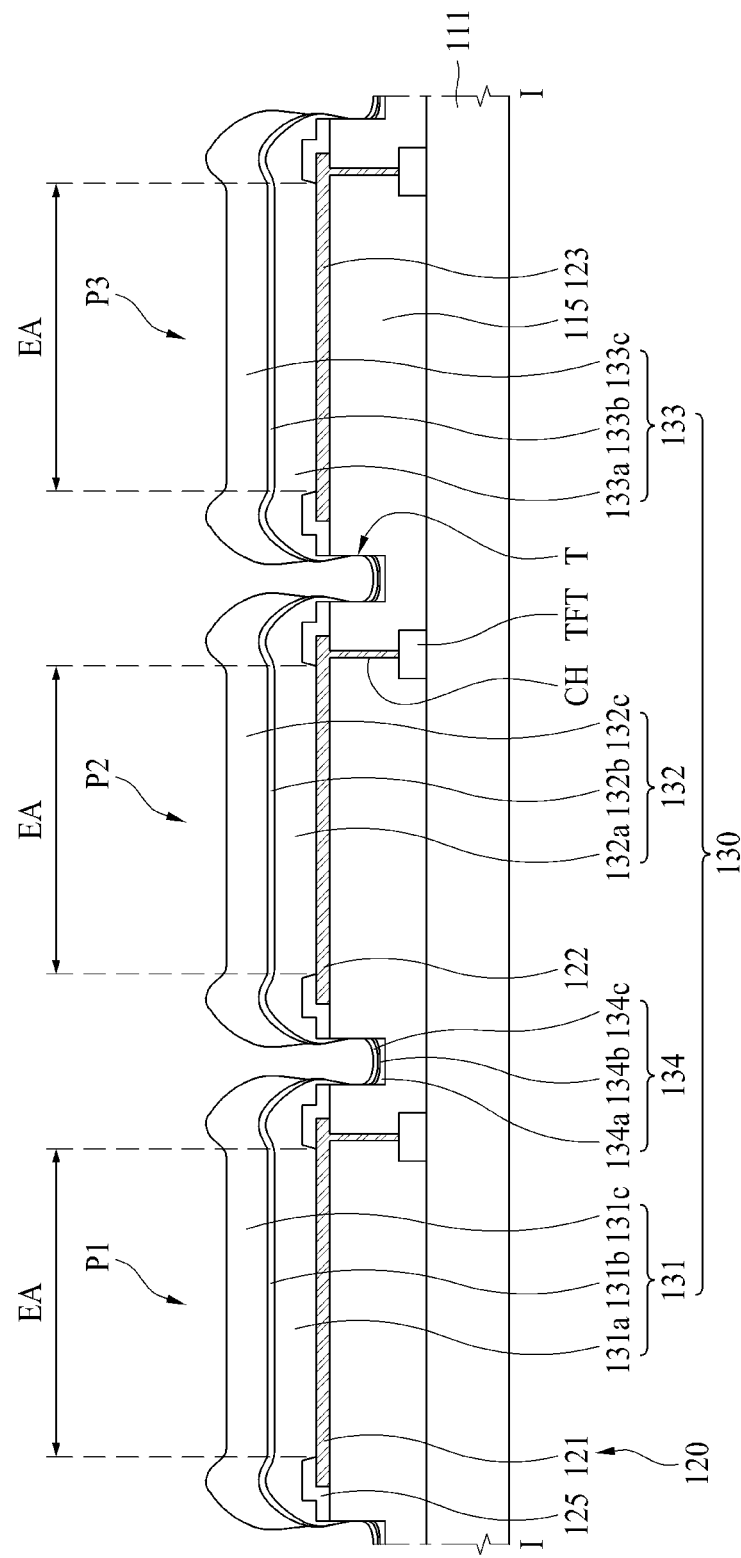

Next, the light emitting layer 130 is formed (S804). In more detail, as shown in FIG. 9E, the first stacks 131a, 132a, and 133a, the charge generating layers 131b, 132b, and 133b and the second stacks 131c, 132c, and 133c are formed over the first electrodes 121, 122, and 123 in due order.

First of all, the first stacks 131a, 132a, and 133a are formed over the first electrodes 121, 122, and 123. The first stacks 131a, 132a, and 133a may be formed by a deposition process or a solution process. If the first stacks 131a, 132a, and 133a are formed by a deposition process, the first stacks 131a, 132a, and 133a may be formed using an evaporation method. The first stacks 131a, 132a, and 133a are disconnected among the subpixels P1, P2 and P3.

The first stacks 131a, 132a, and 133a may be formed in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

Then, the charge generating layers 131b, 132b, and 133b are formed over the first stacks 131a, 132a, and 133a. The charge generating layers 131b, 132b, and 133b are disconnected among the subpixels P1, P2, and P3.

Then, the second stacks 131c, 132c, and 133c are formed over the charge generating layers 131b, 132b, and 133b. The second stacks 131c, 132c, and 133c may be formed by a deposition process or a solution process. If the second stack 133 is formed by a deposition process, the second stack 133 may be formed using an evaporation method. The second stacks 131c, 132c, and 133c are disconnected among the subpixels P1, P2, and P3.

The second stacks 131c, 132c, and 133c may be formed in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

Figure 9F:
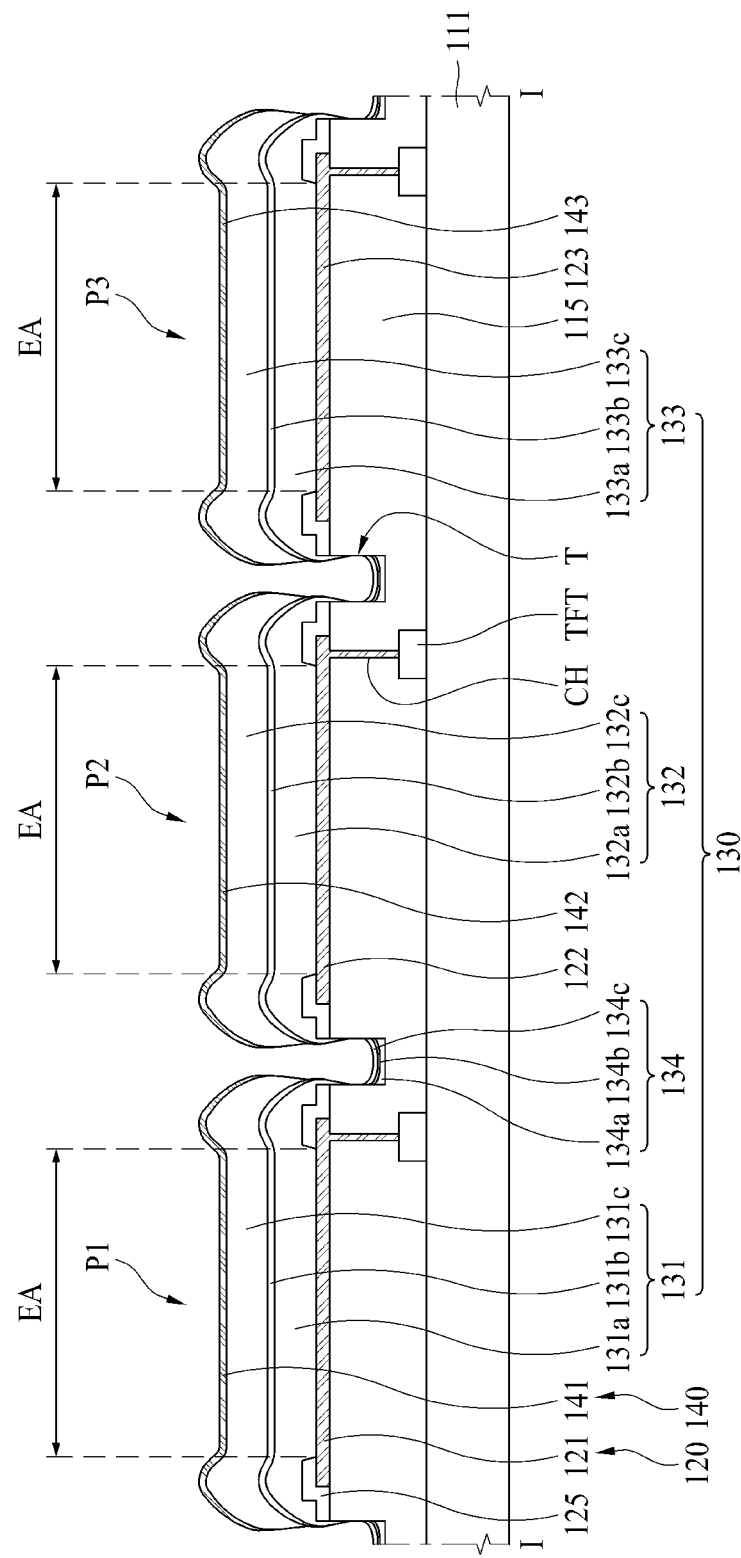

Next, the second electrode 140 is formed (S805). In more detail, as shown in FIG. 9F, the second electrodes 141, 142, and 143 are formed over the light emitting layers 131, 132, and 133. The second electrode 140 may be formed by an evaporation method. If the second electrode 140 is formed by an evaporation method, the second electrode 140 is deposited over the light emitting layers 131, 132, and 133 due to good linearity but is not deposited over the sides of the light emitting layers 131, 132, and 133.

If the second electrodes 141, 142, and 143 are formed by an evaporation method, the second electrodes 141, 142, and 143 are deposited over the light emitting layers 131, 132, and 133 due to good linearity but are not deposited over the sides of the light emitting layers 131, 132, and 133. That is, the second electrodes 141, 142, and 143 formed by the evaporation method do not have good step coverage characteristic.

The second electrodes 141, 142, and 143 may be formed of a transparent metal material, a semi-transmissive metal material, or a metal material with high reflectance. If the display device 100 is formed in the top emission type, the second electrodes 141, 142, and 143 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, second electrodes 141, 142, and 143 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper (Cu), and etc. The second electrodes 141, 142, and 143 may be a cathode electrode.

Next, the second insulating layer 150 and the first insulating layer 160 are formed (S806).

First of all, as shown in FIG. 9G, an insulating material 165 is deposited over the second electrodes 141, 142, and 143. The insulating material 165 may be deposited over the convex first upper surface US1, the second upper surface, and the inclined third upper surface US3 of the second electrodes 141, 142, and 143. At this time, since the insulating material 165 has great viscosity, the insulating material may fail to fill the spaces among the subpixels P1, P2, and P3. The spaces among the subpixels P1, P2 and P3 mean spaces formed by disconnection among the light emitting layers 131, 132 and 133 and disconnection among the second electrodes 141, 142 and 143 in the trench T.

Moreover, the light emitting layers 131, 132 and 133 and the second electrodes 141, 142, and 143 are formed in due order, whereby the spaces among the subpixels P1, P2, and P3 may be narrower. Since the insulating material 165 fails to sufficiently enter the narrow spaces among the subpixels P1, P2 and P3, the spaces among the subpixels P1, P2 and P3 may not be filled by the insulating material 165 completely. Therefore, the insulating material 165 may not cover the charge generating layers 131*b*, 132*b* and 133*b* exposed from the trench T.

Next, if the first substrate 111 deposited with the insulating material 165 is heated, a temperature of the insulating material 165 is increased and its viscosity may be reduced. Particularly, if the temperature of the insulating material 165 becomes greater than a glass transition temperature Tg or a melting point Tm, viscosity of the insulating material 165 is lowered and has flexibility.

Figure 9H:
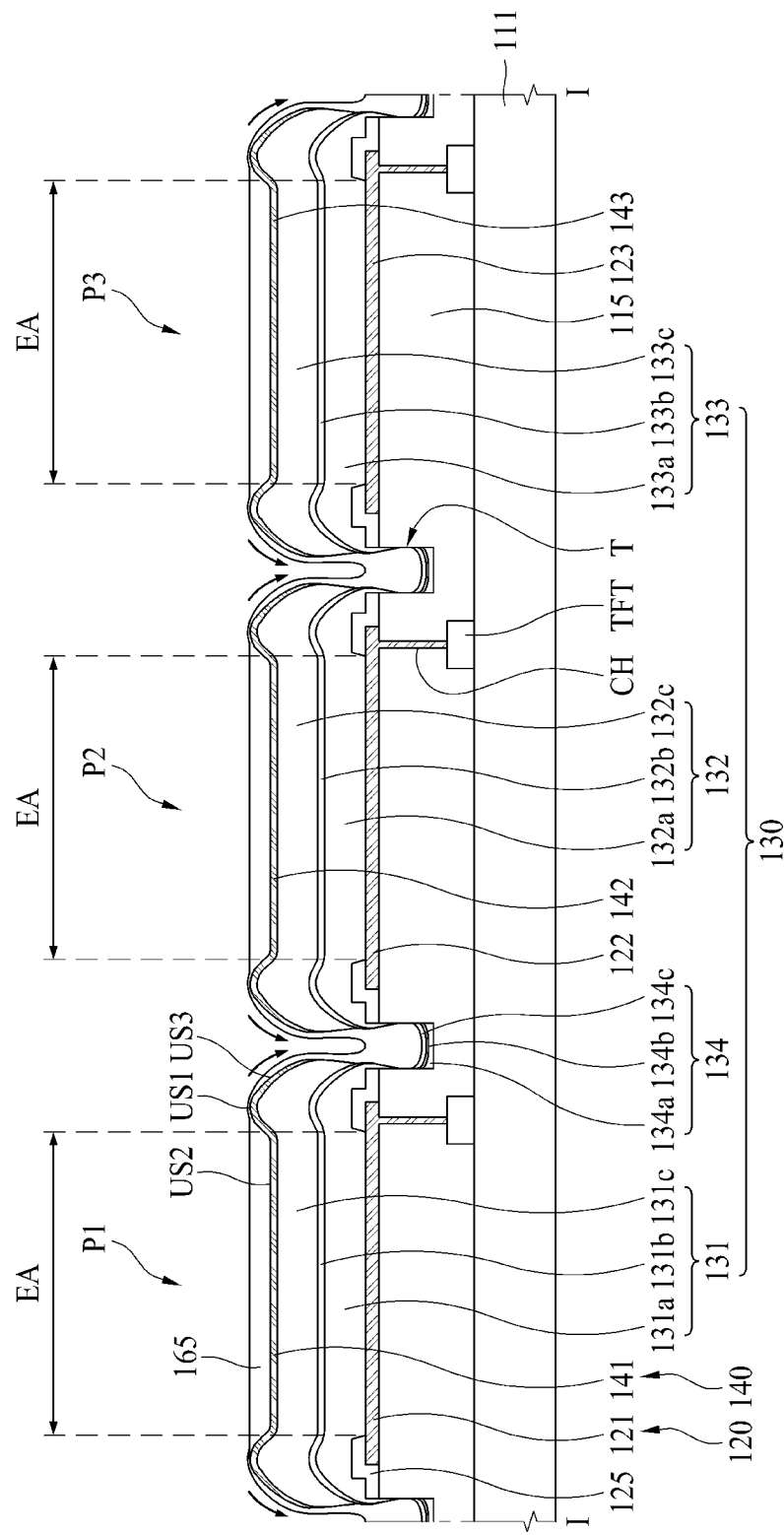

Next, as shown in FIG. 9H, the insulating material 165 having flexibility flows along the inclined third upper surface US3 of the second electrodes 141, 142, and 143. Therefore, the insulating material 165 is filled in the space formed by disconnection among the light emitting layers 131, 132, and 133 and disconnection among the second electrode 141, 142, and 143 in the trench T.

Also, the insulating material 165 deposited over the convex first upper surface US1 of the second electrodes 141, 142, and 143 flows to the second upper surface US2 or the third upper surface US3 along the inclined surface. Therefore, at least a portion of the first upper surface US1 of the second electrodes 141, 142, and 143 is exposed.

Figure 9I:
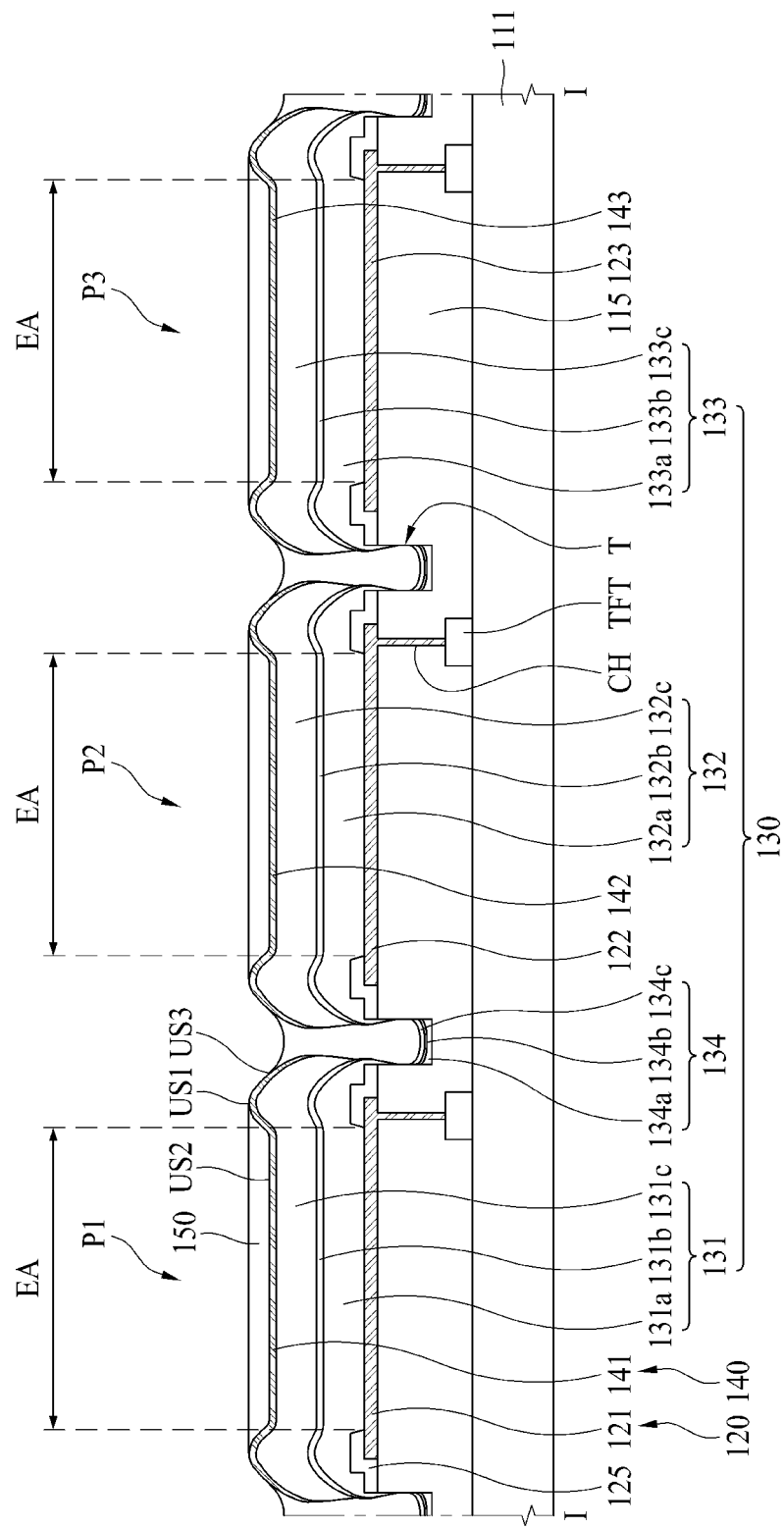

Consequently, as shown in FIG. 9I, the insulating material 165 is arranged over the second upper surface US2 of the second electrodes 141, 142, and 143, and in the space formed by disconnection among the light emitting layers 131, 132, and 133 and disconnection among the second electrodes 141, 142, and 143 in the trench T.

The insulating material 165 arranged over the second upper surface US2 of the second electrodes 141, 142, and 143 becomes the second insulating layer 150 and serves as a capping layer. Also, the insulating material 165 arranged in the spaces among the subpixels P1, P2, and P3 becomes the first insulating layer 160 and prevents a current from leaking among the adjacent subpixels P1, P2, and P3.

Figure 9J:
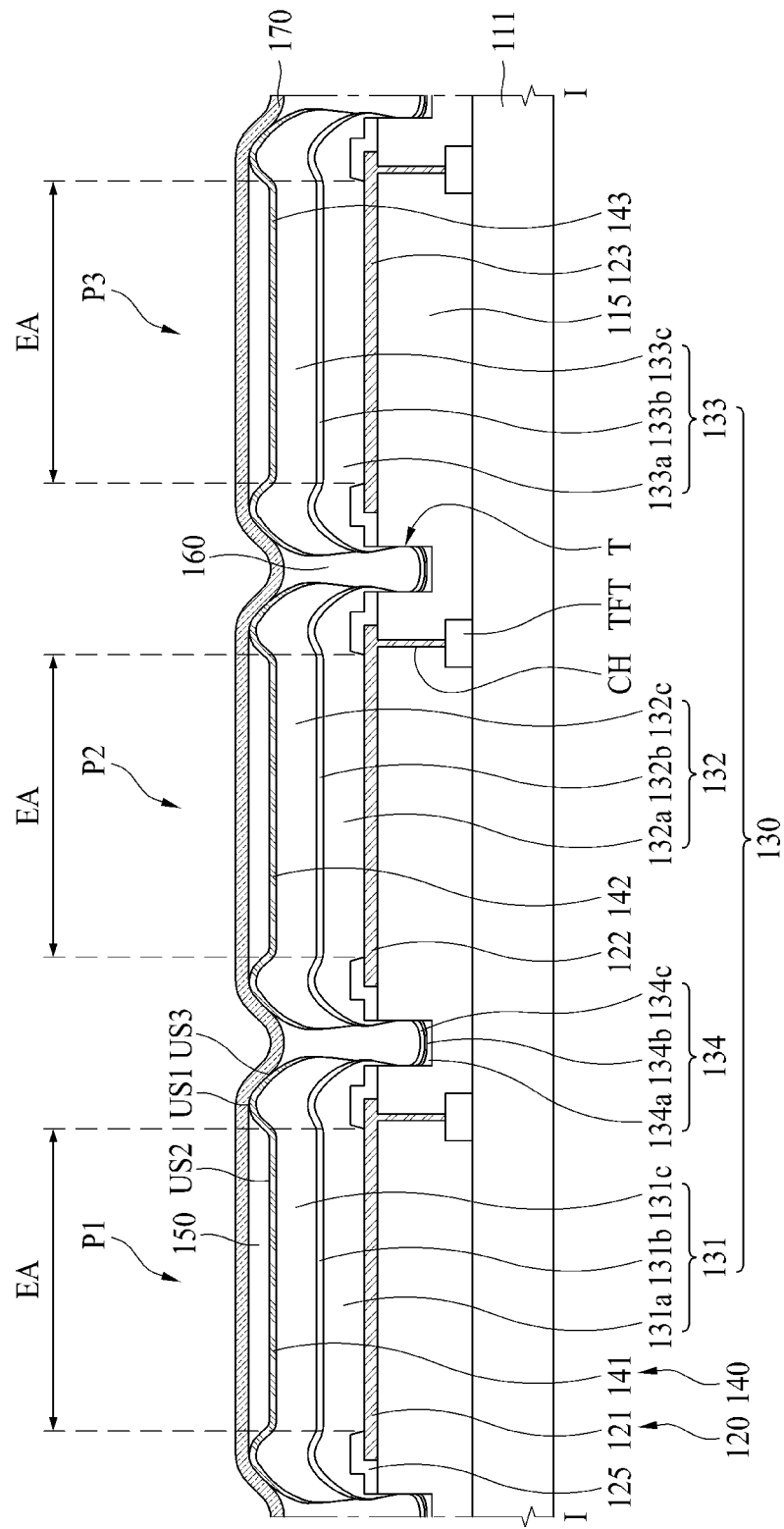

Then, the third electrode 170 is formed (S807). In more detail, as shown in FIG. 9J, the third electrode 170 is formed over the second insulating layer 150 and the first insulating layer 160. At this time, the third electrode 170 is also formed over portions of the second electrodes 141, 142, and 143 exposed without being covered by the first insulating layer 160 and the second insulating layer 150.

The upper surface of the second electrodes 141, 142, and 143 is partially exposed for each of the subpixels P1, P2, and P3 without being covered by the second insulating layer 150 and the first insulating layer 160. Therefore, the third electrode 170 is electrically connected with the second electrodes 141, 142, and 143 respectively provided in the subpixels P1, P2, and P3. Also, the second electrodes 141, 142, and 143 respectively provided in the subpixels P1, P2, and P3 are electrically connected with one another through the third electrode 170.

The third electrode 170 may be formed of a transparent metal material, a semi-transmissive metal material, or a metal material with high reflectance. If the display device 100 is formed in the top emission type, the third electrode 170 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the third electrode 170 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper (Cu), and etc. The third electrode 170 may be a cathode electrode.

Figure 9K:
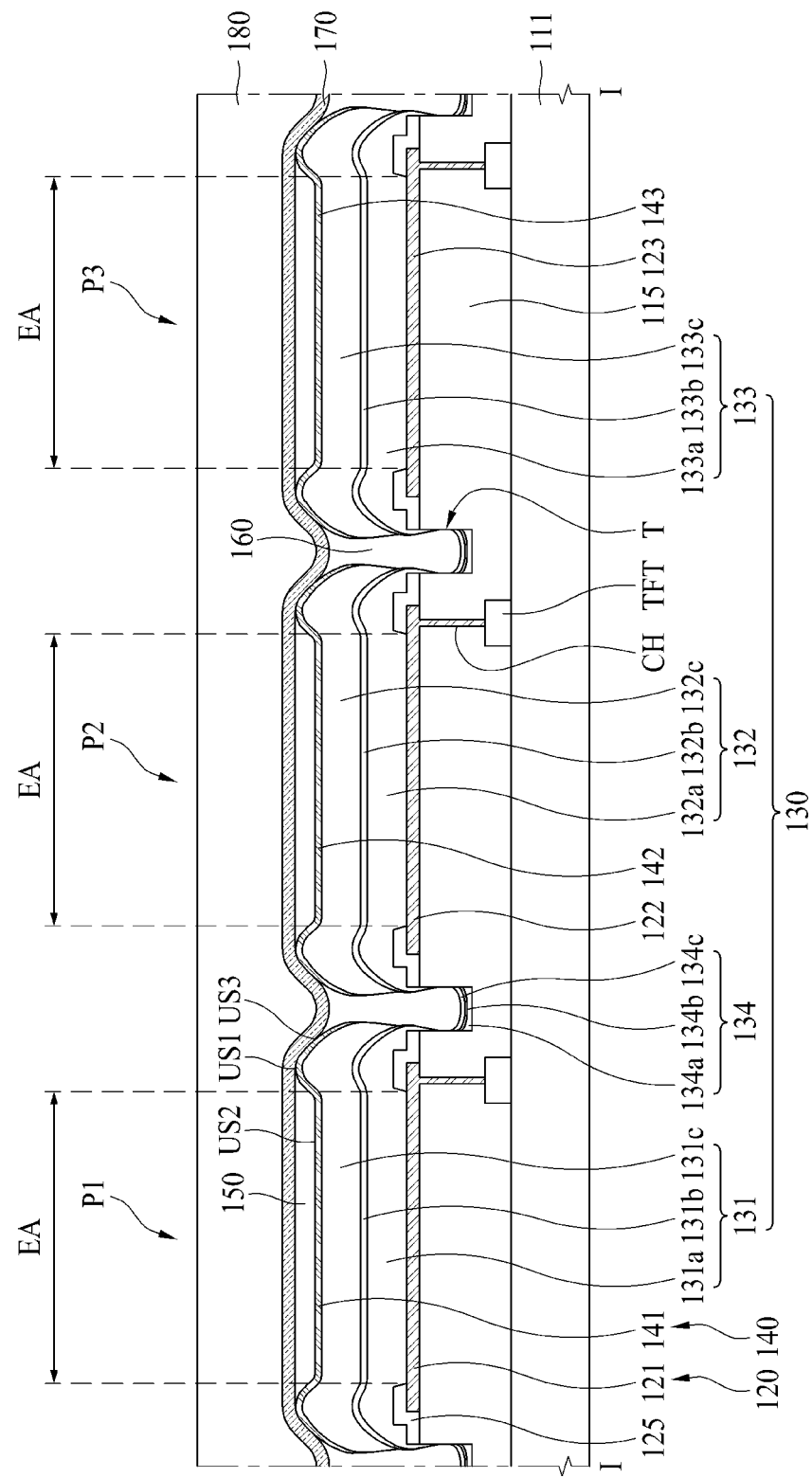

Next, the encapsulation film 180 is formed (S808). In more detail, as shown in FIG. 9K, the encapsulation film 180 is formed over the third electrode 170. The encapsulation film 180 may include a first inorganic film and an organic film. In one embodiment, the encapsulation film 180 may further include a second inorganic film.

The first inorganic film is formed over the third electrode 170. Then, the organic film is formed over the first inorganic film. It is preferable that the organic film is formed at a sufficient thickness to prevent particles from being permeated into the light emitting layer 130, the second electrode 140 and the third electrode 170 by passing through the first inorganic film. Then, the second inorganic film is formed over the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be obtained by a vapor deposition method, a printing method, or a slit coating method, but not limited to these methods. The organic film may be obtained by an ink-jet method.

Figure 9L:
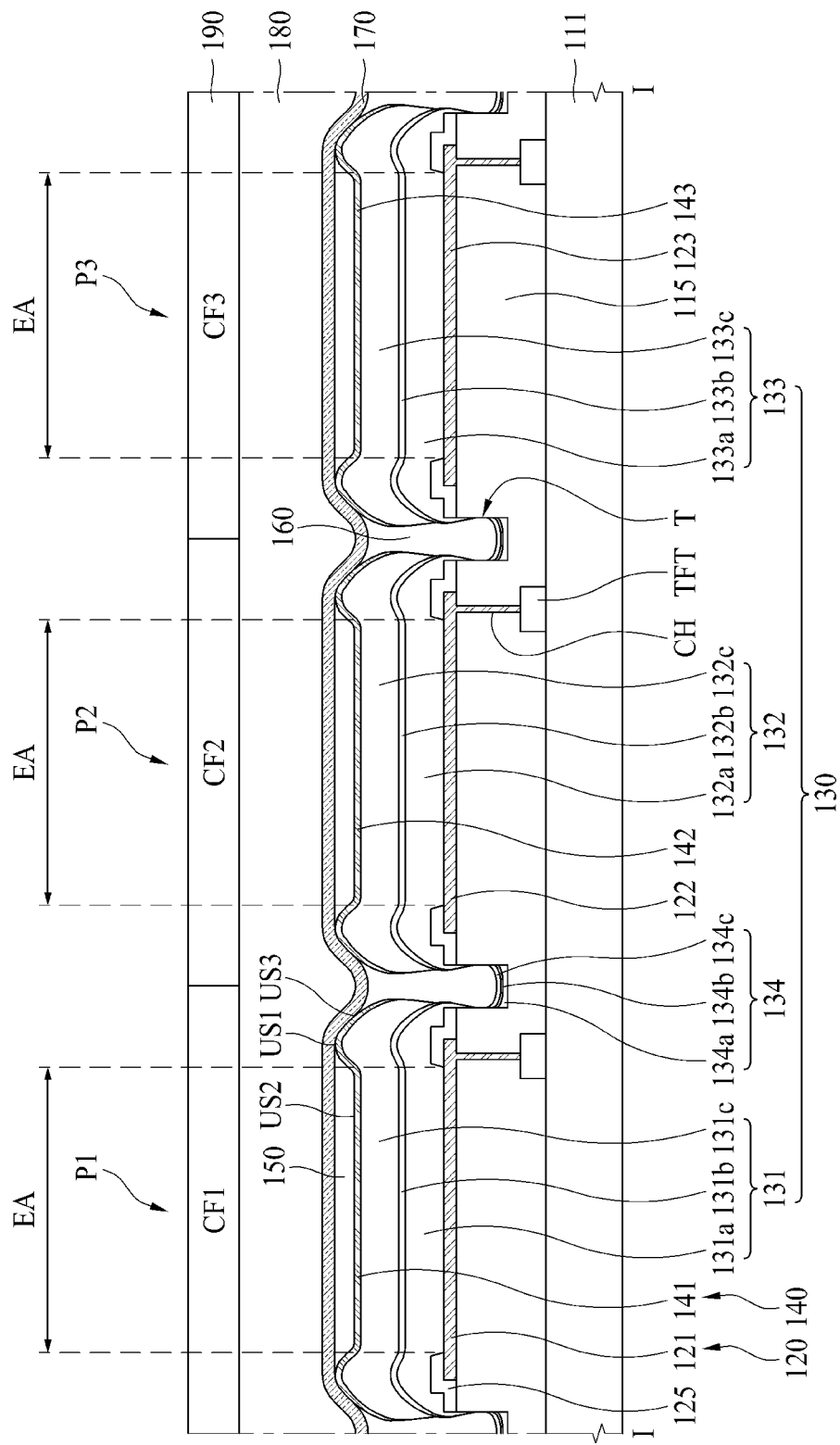

Then, the color filter 190 is formed (S809). In more detail, as shown in FIG. 9L, the color filter 190 is formed over the encapsulation film 180. The color filter 190 includes a first color filter CF1 arranged to correspond to the first subpixel P1, a second color filter CF2 arranged to correspond to the second subpixel P2, and a third color filter CF3 arranged to correspond to the third subpixel P3. The first color filter CF1 may be a red color filter transmitting red light, the second color filter CF2 may be a green color filter transmitting green light, and the third color filter CF3 may be a blue color filter transmitting blue light.

Note that, although the display device and the method for manufacturing the display device according to the embodiment of the present disclosure have been described above, by taking the case where the display device includes the first subpixel, the second subpixel, and the third subpixel as an example, according to another embodiment of the present disclosure, the display device may include only the first subpixel and the second subpixels, but not include the third subpixel.

Figure 10A:
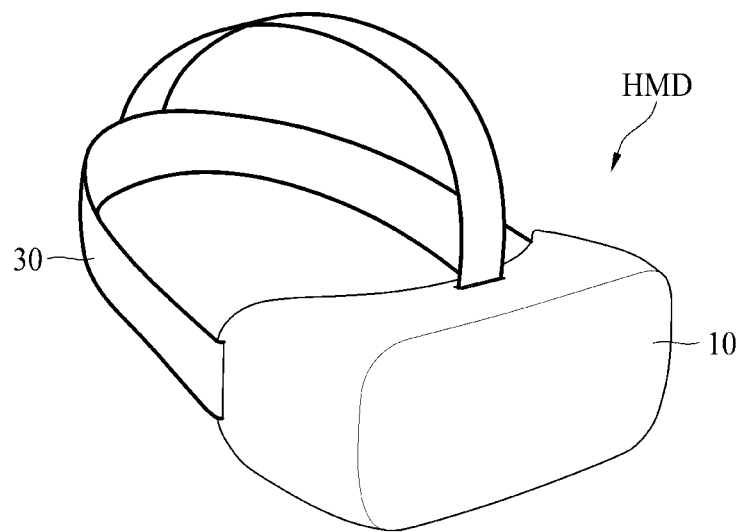
FIGS. 10A to 10C are diagrams illustrating a head-mounted display (HMD) employing a display device according to another embodiment of the present disclosure.
Figure 10B:
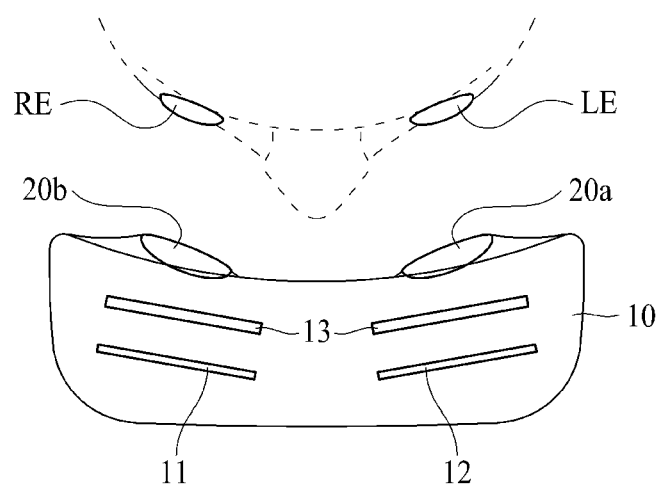
Figure 10C:
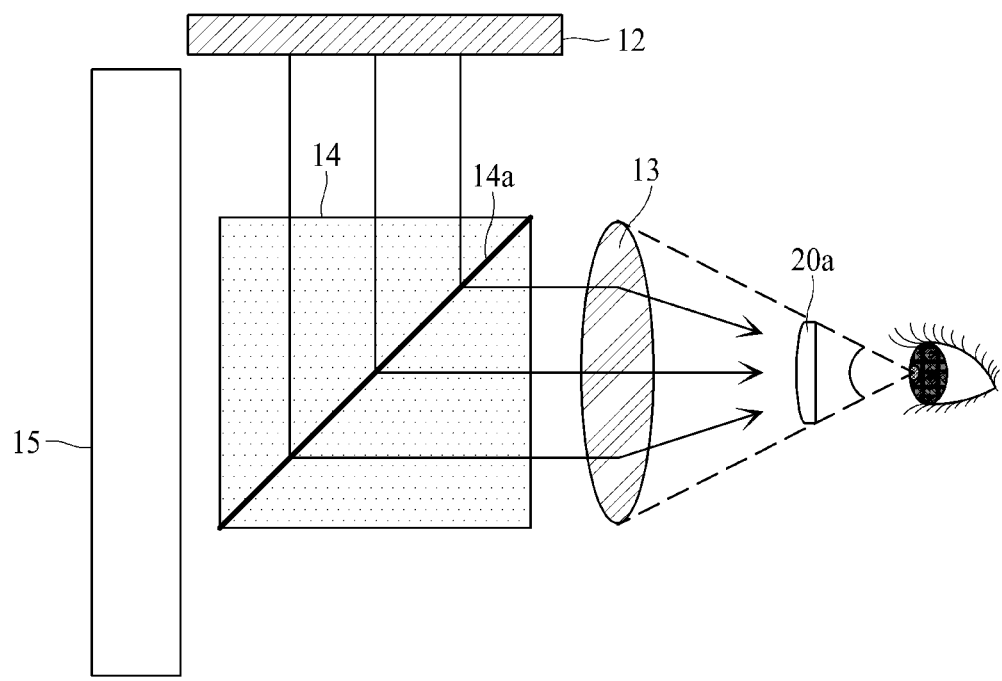

FIGS. 10A to 10C illustrate a display device according to another embodiment of the present disclosure, which relate to a head mounted display (HMD). FIG. 10A is a schematic perspective view, FIG. 10B is a schematic plane view of a virtual reality (VR) structure, and FIG. 10C is a cross sectional view of an augmented reality (AR) structure according to one embodiment of the present disclosure.

As shown in FIG. 10A, the head mounted display (HMD) according to the present disclosure includes a receiving case 10, and a head mounted band 30.

A display device, a lens array, and an ocular eyepiece may be received in the inside of the receiving case 10.

The head mounted band 30 is fixed to the receiving case 10. In the drawings, the head mounted band 30 is configured to surround an upper surface and both lateral surfaces in a user's head, but not limited to this structure. For example, the head mounted band is provided to fix the head mounted display (HMD) to a user's head, which may be substituted by an eyeglass-frame shape or a helmet-shaped structure.

As shown in FIG. 10B, the head mounted display (HMD) of the virtual reality (VR) structure according to the present disclosure includes a left-eye display device 12, a right-eye display device 11, a lens array 13, a left-eye ocular eyepiece 20a, and a right-eye ocular eyepiece 20b.

The left-eye display device 12, the right-eye display device 11, the lens array 13, and the left-eye ocular eyepiece 20a, and the right-eye ocular eyepiece 20b are received in the aforementioned receiving case 10.

The same image may be displayed on the left-eye display device 12 and the right-eye display device 11. In this case, a user can watch a two-dimensional (2D) image. If an image for a left eye is displayed on the left-eye display device 12, and an image for a right eye is displayed on the right-eye display device 11, a user can watch a three-dimensional (3D) image. Each of the left-eye display device 12 and the right-eye display device 11 may be formed of the aforementioned display device shown in FIGS. 1 to 7. In this case, an upper portion corresponding to a surface for displaying an image in FIGS. 1 to 7, for example, the color filter 190 confronts the lens array 13.

The lens array 13 may be disposed between the left-eye ocular eyepiece 20a and the left-eye display device 12 while being apart from each of the left-eye ocular eyepiece 20a and the left-eye display device 12. That is, the lens array 13 may be positioned at the front of the left-eye ocular eyepiece 20a and at the rear of the left-eye display device 12. Also, the lens array 13 may be disposed between the right-eye ocular eyepiece 20b and the right-eye display device 11 while being apart from each of the right-eye ocular eyepiece 20b and the right-eye display device 11. That is, the lens array 13 may be positioned at the front of the right-eye ocular eyepiece 20b and at the rear of the right-eye display device 11.

The lens array 13 may be a micro lens array. The lens array 13 may be substituted by a pin hole array. Owing to the lens array 13, an image displayed on the left-eye display device 12 or the right-eye display device 11 may be expanded and perceived by a user.

A user's left eye (LE) may be positioned at the left-eye ocular eyepiece 20a, and a user's right eye (RE) may be positioned at the right-eye ocular eyepiece 20b.

As shown in FIG. 10C, the head mounted display (HMD) of the augmented reality (AR) structure according to the present disclosure includes a left-eye display device 12, a lens array 13, a left-eye ocular eyepiece 20a, a transmissive reflecting portion 14, and a transmission window 15. FIG. 10C shows only the left-eye structure, for convenience of explanation. The right-eye structure is identical in structure to the left-eye structure.

The left-eye display device 12, the lens array 13, the left-eye ocular eyepiece 20a, the transmissive reflecting portion 14, and the transmission window 15 are received in the aforementioned receiving case 10.

The left-eye display device 12 may be disposed at one side of the transmissive reflecting portion 14, for example, an upper side of the transmissive reflecting portion 14 without covering the transmission window 15. Accordingly, an image may be provided to the transmissive reflecting portion 14 under the condition that an ambient background seen through the transmission window 15 is not covered by the left-eye display device 12.

The left-eye display device 12 may be formed of the display device shown in FIGS. 1 to 7. In this case, an upper portion corresponding to a surface for displaying an image in FIGS. 1 to 7, for example, the color filter 190 confronts the transmissive reflecting portion 14.

The lens array 13 may be provided between the left-eye ocular eyepiece 20a and the transmissive reflecting portion 14.

A user's left eye is positioned at the left-eye ocular eyepiece 20a.

The transmissive reflecting portion 14 is disposed between the lens array 13 and the transmission window 15. The transmissive reflecting portion 14 may include a reflection surface 14a which partially transmits some of light, and also reflects the remaining light. The reflection surface 14a is configured to guide an image, which is displayed on the left-eye display device 12, toward the lens array 13. Thus, a user can watch an image displayed on the left-eye display device 12 together with the ambient background through the transmission window 15. That is, a user can watch one image obtained by a virtual image overlaid with the ambient real background, to thereby realize an augmented reality (AR).

The transmission window 15 is disposed in front of the transmissive reflecting portion 14.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
   a substrate;

a first electrode provided in each of a first subpixel and a second subpixel adjacent to the first subpixel, over the substrate;

a trench provided between the first subpixel and the second subpixel;

a light emitting layer provided in each of the first subpixel and the second subpixel over the first electrode;

a second electrode provided in each of the first subpixel and the second subpixel on the light emitting layer; and a third electrode electrically connecting the second electrode provided in the first subpixel with the second electrode provided in the second subpixel, wherein the second electrode provided in the first subpixel and the second electrode provided in the second subpixel are spaced apart from each other, and wherein the second electrode is cut between the first subpixel and the second subpixel by the trench.

2. The display device of claim 1, wherein the light emitting layer is disconnected between the first subpixel and the second subpixel by the trench.

3. The display device of claim 2, wherein the light emitting layer includes a first stack, a second stack, and a charge generating layer provided between the first stack and the second stack, wherein the charge generating layer is disconnected between the first subpixel and the second subpixel by the trench.

4. The display device of claim 3, wherein the second electrode is spaced apart from the charge generating layer.

5. The display device of claim 1, wherein the third electrode is provided on the second electrode.

6. The display device of claim 1, wherein the third electrode contacts a portion of the second electrode provided in the first subpixel and another portion of the second electrode provided in the second subpixel.

7. The display device of claim 1, wherein the third electrode is connected between the first subpixel and the second subpixel.

8. The display device of claim 1, wherein the second electrode is made of a semi-transmissive metal material, and the third electrode is made of a transparent metal material.

9. The display device of claim 1, further comprising a first insulating layer provided between the first subpixel and the second subpixel.

10. The display device of claim 9, wherein the first insulating layer is provided between the light emitting layer provided in the first subpixel and the light emitting layer provided in the second subpixel and between the second electrode provided in the first subpixel and the second electrode provided in the second subpixel.

11. The display device of claim 9, wherein the third electrode is provided on the second electrode, the display device further comprising a second insulating layer provided between the second electrode and the third electrode.

12. The display device of claim 11, wherein the first insulating layer is made of a same organic material as that of the second insulating layer.

13. The display device of claim 11, wherein the first insulating layer and the second insulating layer are provided to expose a portion of the second electrode provided in the first subpixel and another portion of the second electrode provided in the second subpixel, and the third electrode contacts the exposed portion of the second electrode provided in the first subpixel and the exposed another portion of the second electrode provided in the second subpixel.

* * * * *